US012670378B2

(12) United States Patent
Pham et al.

(10) Patent No.: US 12,670,378 B2
(45) Date of Patent: Jun. 30, 2026

(54) MEMRISTOR STRUCTURES WITH ANALOG SWITCHING CHARACTERISTICS AND METHOD FOR FABRICATING THE SAME

(71) Applicants: Ngoc Kim Pham, Di An (VN); Quan Phu Pham, Ho Chi Minh (VN); Thang Bach Phan, Ho Chi Minh (VN); Thuat Tran Nguyen, Ha Noi (VN)

(72) Inventors: Ngoc Kim Pham, Di An (VN); Quan Phu Pham, Ho Chi Minh (VN); Thang Bach Phan, Ho Chi Minh (VN); Thuat Tran Nguyen, Ha Noi (VN)

(73) Assignee: VNUHCM-University of Science, Ho Chi Minh (VN)

( * ) Notice: Subject to any disclaimer, the term of this patent is extended or adjusted under 35 U.S.C. 154(b) by 0 days.

(21) Appl. No.: 18/736,611

(22) Filed: Jun. 7, 2024

(65) Prior Publication Data
US 2025/0378318 A1 Dec. 11, 2025

(51) Int. Cl.
*G06N 3/065* (2023.01)
*H10N 70/00* (2023.01)
*H10N 70/20* (2023.01)

(52) U.S. Cl.
CPC ........... *G06N 3/065* (2023.01); *H10N 70/026* (2023.02); *H10N 70/24* (2023.02); *H10N 70/841* (2023.02); *H10N 70/8833* (2023.02)

(58) Field of Classification Search
CPC .. G06N 3/065; H10N 70/026; H10N 70/8833; H10N 70/841; H10N 70/24
See application file for complete search history.

(56) References Cited

U.S. PATENT DOCUMENTS

| | | | | |
|---|---|---|---|---|
| 5,739,049 A * | 4/1998 | Park | ........................ | H01L 28/40 438/239 |
| 2002/0039000 A1* | 4/2002 | Shirakawa | ............. | H05B 33/10 313/506 |
| 2002/0146871 A1* | 10/2002 | Watanabe | ......... | H01L 29/78618 257/E21.414 |
| 2010/0155685 A1* | 6/2010 | Hurkx | ................ | H10N 70/8825 257/3 |
| 2011/0041980 A1* | 2/2011 | Kim | ........................ | H10K 30/81 156/60 |
| 2011/0160065 A1* | 6/2011 | Aytug | ............... | H01L 21/32058 428/209 |
| 2012/0012809 A1* | 1/2012 | Yang | ........................ | H10B 63/20 257/E27.002 |

(Continued)

OTHER PUBLICATIONS

La Barbera et al., "Filamentary Switching: Synaptic Plasticity through Device Volatility" ACS Nano 2015 9 (1), 941-949, DOI: 10.1021/nn506735m (Year: 2015).*

*Primary Examiner* — James D. Rutten

(57) ABSTRACT

A method for fabricating a memristor and a memristor device are disclosed which comprises: depositing a first metal electrode on a substrate; depositing a Chromium oxide $(CrO_x)$ layer directly on top of a first metal electrode; depositing a Titanium oxide $(TiO_y)$ layer directly on top of the $CrO_x$ layer; and depositing a second metal electrode on the $TiO_y$ layer.

20 Claims, 16 Drawing Sheets

700A

(56) References Cited

U.S. PATENT DOCUMENTS

| | | | | |
|---|---|---|---|---|
| 2015/0041751 A1* | 2/2015 | Zhang | G11C 13/003 | |
| | | | 257/43 | |
| 2017/0018654 A1* | 1/2017 | Chang | H01L 29/247 | |
| 2017/0200495 A1* | 7/2017 | Cho | H10N 70/826 | |
| 2017/0206957 A1* | 7/2017 | Kim | G11C 13/0061 | |
| 2017/0250223 A1* | 8/2017 | Ge | H10N 70/826 | |
| 2017/0271591 A1* | 9/2017 | Jackson | G11C 13/0007 | |
| 2019/0229260 A1* | 7/2019 | Wang | H10N 50/80 | |
| 2021/0274650 A1* | 9/2021 | Ishii | B32B 17/06 | |
| 2023/0301215 A1* | 9/2023 | Li | H10B 63/22 | |
| | | | 257/4 | |
| 2024/0409395 A1* | 12/2024 | Lee | B81B 7/0038 | |

* cited by examiner (PRIOR-ART)

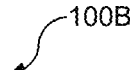
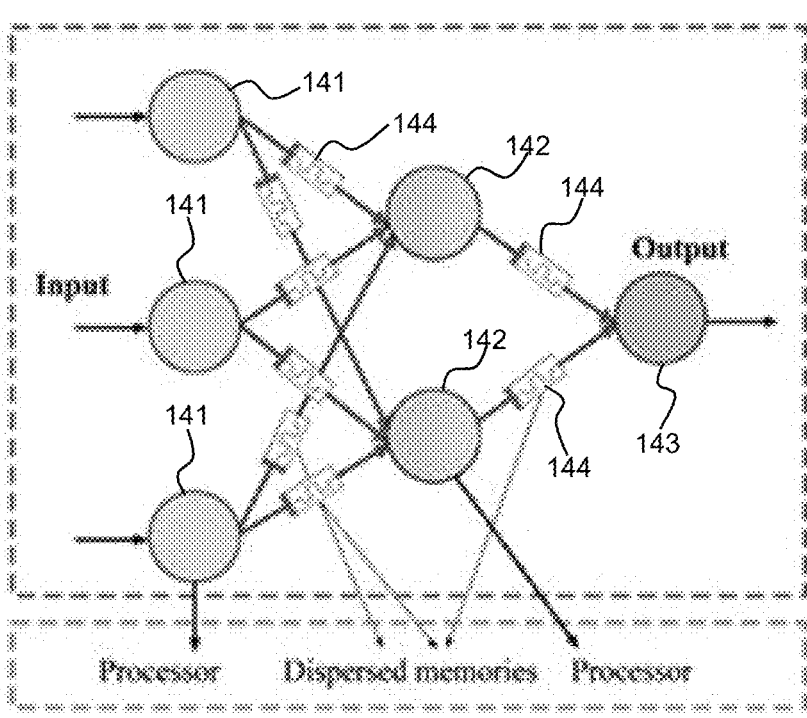
FIG. 1B
(PRIOR-ART)

FIG. 7A                    FIG. 7B

MEMRISTOR STRUCTURES WITH ANALOG SWITCHING CHARACTERISTICS AND METHOD FOR FABRICATING THE SAME

FIELD OF THE INVENTION

The present invention relates generally to electrical components. More specifically, the present invention relates to a synaptic memory device applicable in neuromorphic computing system.

BACKGROUND ART

Today, artificial intelligence (AI) including machine learning (ML) and neural networks (NN), is continuously developed to solve complex problems that require big data, very large scale integration, and computing power [1-4]. On the software aspect of AI, neural network algorithms and modeling such as convolutional neural network (CNN), recurrent neural network (RCNN), long short-term memory network (LSTM), or generative adversarial network (GAN), etc. are required. On the hardware aspect, neuromorphic architectures with graphic processing units (GPU) are developed to support neural network modeling and software.

Referring now to FIG. 1A, an AI development of a prior-art artificial neural network (ANN) 100A is illustrated. Prior-art ANNs 100A mimics the structure and functions of the human brain [5,6]. However, prior-art ANNs 100A, which uses the Von Neumann architecture, consists of a memory bank 110 connected to a computing unit 120. Computing unit 120 includes neurons 121, 122, and 123 that form a one-layer neural network. Neurons 121, 122, and 123 are connected together by communication (synaptic) links 124 at the respective nodes. Communication links 124 may be electrical cables or wires including twisted pair cables or coaxial cables. Communication links 124 may also be fiber optic cables. Input neurons 121 accept stimulating signals from the outside world. These input neurons 121 provide data to a hidden layer 122 having synapses 125. Each synapse 125 provides synaptic weights and an activation function to all stimulating signals 121 as inputs. The weight function adds up all the stimuli of input neurons 121. The activation function decides whether a specific event occurs. These functions may be sigmoid (sgn), ReLU, leaky ReLU, or tanhx function. Neurons 121-123 are interconnected together via synapses 125. In prior-art ANN 100A, each synapse 125 must provide synaptic weights by connecting to a bank of static random access memory (SRAM) 110. SRAM bank 110 includes a multiplexer 111, an array of SRAM cells 112, and output circuitry 113. To detect a specific input, each synapse 125 is learned or programmed to include a certain number of SRAM cells 112. The weights of synapses 125 undergo adjustments during a learning process [7-10]. However, prior-art ANNs 100A—based on conventional Von Neumann architecture—use complementary field effect transistors (CMOS) as memory cells. Consequently, ANNs 100A often encounter data bottleneck 132, high power consumption, and limited large-scale integration governed by the Moore's law.

Continuing with FIG. 1A, prior-art semiconductor devices such as CMOS suffer from high power consumption and large-scale integration. They have lost ground in modern computational tasks because they are governed by the Moore law that limits device integration. Furthermore, CMOS devices used in ANNs 100A consume significant chip area and power. Hence, CMOS devices are not feasible in modern neural networks. Furthermore, CMOS devices cannot provide various weight factors as do biological synapses.

Referring next to FIG. 1B, to solve the above problems, researchers are developing neuromorphic computing, a promising approach that tightly integrates memory and computing units in an architecture known as an in-memory computing or neuromorphic ANN 100B (ANN 100B for short). ANN 100B uses prior-art memristors 144 into synaptic lines between input neuron 141, hidden layer neuron 142 and output neuron 143. Compared to Von Neuman's architecture of ANN 100A in FIG. 1A, ANN 100B minimizes data movement, resulting in enhancing the speed and energy efficiency. These improvements in ANN 100B are owned to prior-art memristor 144—a neuromorphic electronic synapse and a crucial element in in-memory computing architectures. Memristor 144 is employed to imitate the functions of biological synapses. Each memristor 144 can generate and store synaptic weights as resistance states throughout ANN 100B [11]. Conventional memristors such as memristor 144 were discovered as the fourth electrical element beside resistors, capacitors, and inductors. Memristor 144 relates capacitive charge (Q) to inductive flux ($\Phi\phi$) whose voltage-current (IV) characteristics can be expressed as V=M (q)*I. This IV characteristic is derived from $$M(q) = \frac{d\varphi}{dq}; \text{ and } \frac{d\varphi}{dt} = M(q) \cdot \frac{dq}{dt}.$$

$$\text{But } \frac{dq}{dt} = I.$$

Comparing to Kirchhoff voltage law (V=R*I), M in V=M (q)*I has dimension of resistance and behaves as biological neurons which can retain, enforce, compute and learn as neural memories. Memristor 144 also expresses plasticity such as short- and long-term plasticity and spike-timing dependent plasticity (STDP). Plasticity is the brain's ability to change its physical structure as a result of learning. In ANN 100B, memristor 144 changes the resistance M (q) according to the input voltages.

Continuing with FIG. 1B, ANN 100B resembles crossbar arrays in which memristor 144 arranged at each cross-point. In many types of prior-art memristors such as memristor 144, cross-talks often occur. This problem causes undesired neural signals in ANN 100B that adversely affect the output currents. The affected output currents, flowing through the designated column lines, severely degrade the learning and memory capability of ANN 100B. In addition, memristor 144 consumes more energy because the synaptic weights need to be stored during the learning process. To solve this cross-talk problems, selectors (not shown) are implemented into ANN 100B to isolate the unwanted signals. However, these selectors increase complexity, power consumption, and costs. Moreover, memristor 144 expresses electrical characteristics falling memristor 144 includes—inter alia—analog behavior, stability, significant hysteresis area, and/or self-rectifying. All of these electrical characteristics are ideally necessary for a memristor to operate as a biological synapses. Memistor 144 and other prior-art memristors only obtain some but not all of these electrochemical characteristics, rendering them unfitted for synapses in neuromorphic neural networks.

To solve the above problems and other performance shortages of the prior-art memristors such as memristor 144, different types of memristors have been researched and tried in neural networks. In one attempt, nano-Ag are incorporated into $SiO_xN_y$ structure to fabricate a memristor structure of $Pt/SiO_xN_y$: $Ag/Pt$ [12]. This configuration allows the memristor to replicate the dynamic behavior of $Ca^{2+}$ or $Na^+$ in synaptic processing accurately. Nevertheless, this prior-art structure of $Pt/SiO_xN_y$: $Ag/Pt$ memristor displays the threshold resistive switching (RS) attributed to the formation and disruption of nano-Ag filaments. Thus, they are identified as filamentary memristors within the switching layer. Reportedly, the analog behavior is effectively mitigated by high resistance state (HRS) and low resistance state (LRS) at the electrode interface that encompasses the entire electrode area. The prior art $Pt/SiO_xN_y$: $Ag/Pt$ memristor belongs to the interface-type RS [13,14]. Simply stated, the prior-art $Pt/SiO_xN_y$: $Ag/Pt$ memristor does not provide smooth analog behavior.

In another attempt, another prior-art memristor having a $Pt/TaO_y$/nanoporous $TaO_x$/Ta junction structure can effectively prevent unwanted neural signals. This prior-art memristor device shows endurance within 1,000 cycles. The trained network consisting of only four memristive synapses of this type can achieve a recognition accuracy of 89.08% after 15 epochs for the Modified National Institute Standards for Technology and Database (MNIST) digital images. The $TaO_y$ layer of this prior-art memristor is fabricated by the DC sputtering process—a cost-effective and highly purified electronic process. However, the nanoporous $TaO_x$ layer is synthesized by hazardous reagents such as acid sulfuric ($H_2SO_4$) and Halide fluoride (HF).

In another attempt by Yu, he presented memristors which are fabricated from a few nanometer thick oxide-stacking multilayer structure of $Pt/HfO_x/TiO_x/HfO_x/TiO_x/TIN$. Although this structure improves the analog RS characteristics, during the SET process of the device, there are still sudden changes in current from about 50 µA up to 1 mA of the compliance current. Besides, Yu's memristor expresses the resistance states of devices that degrade after 100 cycles [15]. This prior-art $Pt/HfO_x/TiO_x/HfO_x/TiO_x/TiN$ memristor lacks stability.

Yet in another recent attempt, a resistive switching of organic/inorganic halide perovskite was presented. This halide perovskite memristor exhibits potential synaptic behavior for neuromorphic. Its stability slightly fluctuates in 180 operating pulses. However, the voltage-current (I-V) characteristics of this prior-art material degrades at the first step. It is not suitable for neuromorphic applications.

In general, metal oxides have been found to maintain high reliability in memristors. Transition metals such as Titanium (Ti), Zirconium (Zr), Hafnium (Hf), Vanadium (V), Niobium (Nb), Tantalum (Ta), Molybdenum (Mo), Tungsten (W), Iron (Fe), Nickel (Ni), and Cobalt (Co) in combination with oxygen (O) elements have been studied and proposed. However, these compounds still have limitations such as complex elemental composition. They require a fully oxidized layer that is in contact with the mixed oxide layer, high process temperature, and high driving voltages.

In sum, until now, researches on these metal oxide memristors have had difficulties controlling analog resistive switching. Other memristor devices based on Gallium (Ga), Tin (Sn) and oxygen (O) demonstrate excellent analog and self-rectifying behavior in negative driving voltages. Unfortunately, the reliability of these devices still pose serious problems for designers. These difficulties include degradation in 30 times of test trials. So far, no specific material/ device system has shown complete characteristics that can be used as effective synapses.

Thus, there is a need for a memristor that shows complete characteristics so as to be suitable for neuromorphic computer application.

There is a need for a memristor that has hysteresis in voltage-current (IV) characteristics that can reliably imitate the learning, storing, weighting, and computing of input signals in a neuromorphic computers.

There is a need for a memristor device that exhibits gradual resistive changes or equivalently analog switching behavior capable of accurately retaining different memory states.

There is a need for a memristor that expresses self-rectifying behavior that realizes potentiation and depression similar to those of biological synapses.

There is a need for a neuromorphic device that achieves significant hysteresis area, thus capable of attaining large operating ranges.

Yet there is a need for a memristor that is immune to cross-talk signals, minimizing misreading signals and errors.

Yet there is a need for a memristor that electrically behaves similar to biological synapses so that neuromorphic computing systems can benefit from them.

There is a need for a memristor that can be integrated in large-scale circuitry without being limited by the Moore law.

There is a need for a memristor that can be manufactured at room temperature by simple and non-hazardous processes.

The method of the present invention meets the above needs and solve the above-described problems.

SUMMARY OF THE INVENTION

Accordingly, an object of the present invention is to provide a synaptic memristor based on a chromium oxide ($CrO_x$) thin film stacked on an amorphous Titan oxide ($TiO_y$).

Another object of the present invention is to provide a method for fabricating a memristor having a $Ti/CrO_x/TiO_y/Cr$ junction structure, which comprises: depositing a first (bottom) metal electrode on a substrate; depositing a Chromium oxide ($CrO_x$) layer directly on top of the first metal electrode; depositing a Titanium oxide ($TiO_y$) layer directly on top of the $CrO_x$ layer; and depositing a second (top or counter) metal electrode directly on the $TiO_y$ layer.

Another object of the present invention is to provide a self-rectifying memristor synapse and 16×16 crossbar array based on the $Ti/CrO_x/TiO_y/Cr$ junction structure that effectively mimics biological synapses.

Another object of the present invention is to provide a memristor device that provides gradual change in currents to obtain hysteresis under both negative and positive voltage sweeping, thus achieving analog resistive switching behaviors, faithfully mimicking biodynamic functions.

Additionally, another object of the present invention is to provide a $Ti/CrO_x/TiO_y/Cr$ memristor characterized by analog switching behavior, self-rectifying, and large hysteresis area (large operation window).

Yet another object of the present invention is to provide a memristor that is simple to manufacture without using hazardous materials.

These and other advantages of the present invention will no doubt become obvious to those of ordinary skill in the art after having read the following detailed description of the preferred embodiments, which are illustrated in the various drawing and figures.

BRIEF DESCRIPTION OF THE DRAWINGS

The accompanying drawings, which are incorporated in and form a part of this specification, illustrate embodiments of the invention and, together with the description, explain the principles of the invention.

FIG. 1B is a schematic diagram of a prior-art ANN that uses neurophormic architecture (in memory computing) that uses memristors as synaptic weights that are suffered from cross-talks and large-scale integration;

Figure 1A:
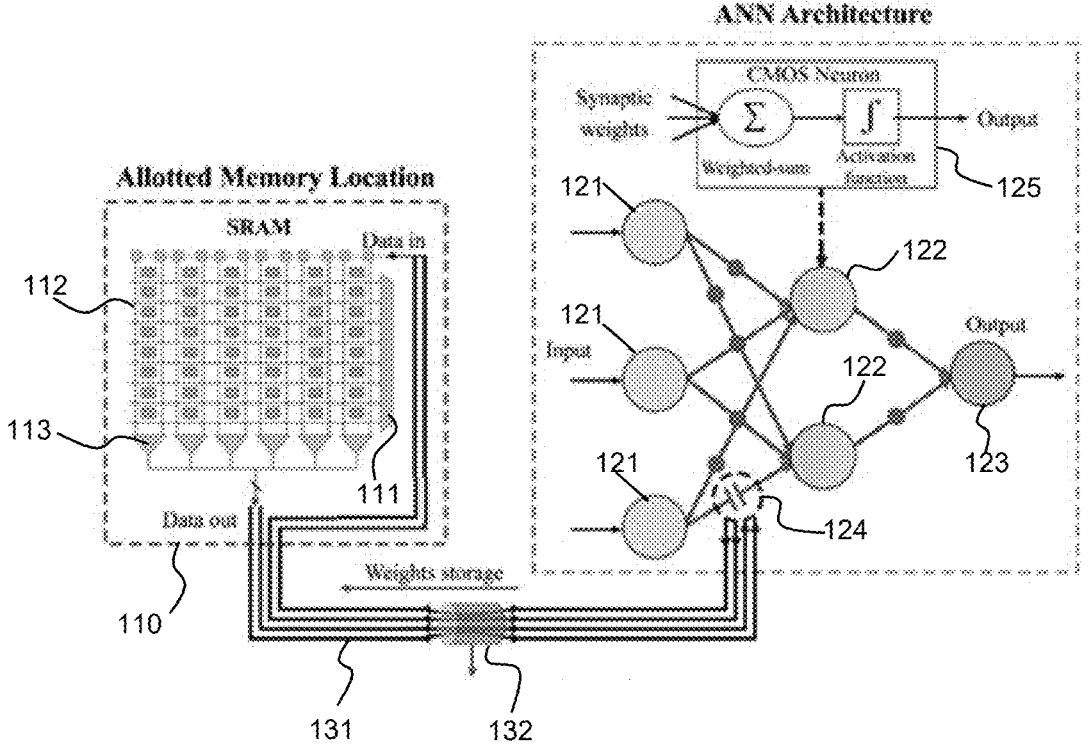
FIG. 1A is a schematic diagram of an artificial neural network (ANN) that uses a Von Neumann architecture that are suffered from computation bottleneck.

The figures depict various embodiments of the technology for the purposes of illustration only. A person of ordinary skill in the art will readily recognize from the following discussion that alternative embodiments of the structures and methods illustrated herein may be employed without departing from the principles of the technology described herein.

DETAILED DESCRIPTION OF THE INVENTION

Reference will now be made in detail to the preferred embodiments of the invention, examples of which are illustrated in the accompanying drawings. While the invention will be described in conjunction with the preferred embodiments, it will be understood that they are not intended to limit the invention to these embodiments. On the contrary, the invention is intended to cover alternatives, modifications and equivalents, which may be included within the spirit and scope of the invention as defined by the appended claims. Furthermore, in the following detailed description of the present invention, numerous specific details are set forth to provide a thorough understanding of the present invention. However, it will be obvious to one of ordinary skill in the art that the present invention may be practiced without these specific details. In other instances, well-known methods, procedures, components, and circuits have not been described in detail so as not to unnecessarily obscure aspects of the present invention.

Within the scope of the present description, the reference to "an embodiment" or "the embodiment" or "some embodiments" means that a particular feature, structure, or element described with reference to an embodiment is comprised in at least one embodiment of the described object. The sentences "in an embodiment," "in the embodiment," or "in some embodiments" in the description do not, therefore, necessarily refer to the same embodiment or embodiments. The features, structures, or elements can be furthermore combined in any adequate way in one or more embodiments.

The present invention provides a method of manufacturing a neuromorphic memristor device (hereinafter abbreviated as "memristor"). The method includes the steps of forming a resistive switching layer on a Titanium (Ti) bottom electrode and forming a Chromium (Cr) top electrode on the resistive switching layer. The resistive switching layer is formed by transitional metal oxide ($MO_x$) including Chromium oxides ($CrO_x$) and Titanium oxides ($TiO_y$) where the subscripts x and y represent the valence states of the compounds. In various embodiments of the present invention, chromium oxides ($CrO_x$) includes, but not limited to chromium (II) oxide CrO, chromium (III) oxide $Cr_2O_3$, chromium (IV) oxide $CrO_2$, chromium (VI) oxide $CrO_3$, chromium (VI) peroxide $CrO_5$, and $Cr_8O_{21}$, etc. Titanium oxides include but not limited to titanium (IV) oxide (titanium dioxide) $TiO_2$, Titanium (II) oxide TiO, Titanium (III) oxide $Ti_2O_3$, $Ti_3O_5$, $Ti_4O_7$, and $Ti_5O_9$, etc. In some other embodiments of the present invention titanium oxides TiOy is represented as $Tl_nO_{2n-1}$, where n=3 to 9.

Figure 2:
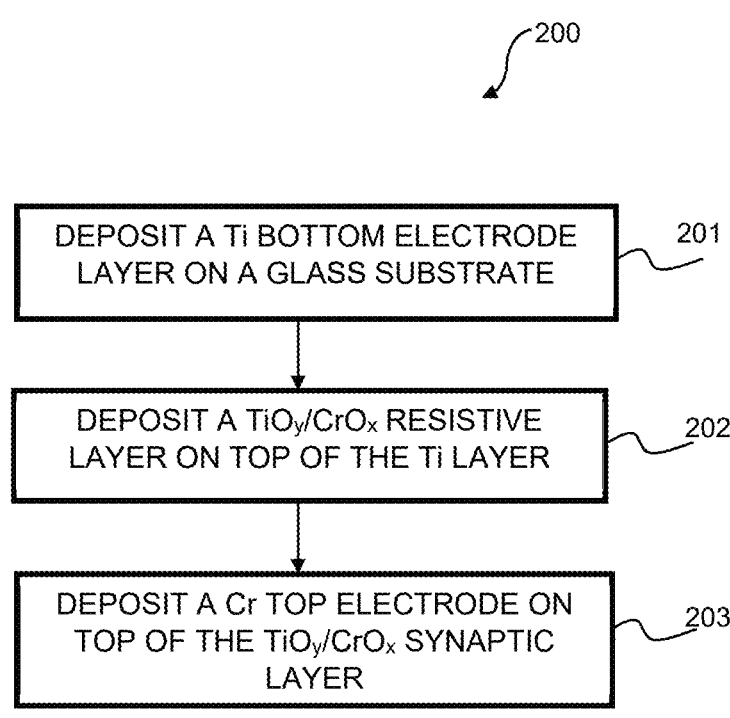
FIG. 2 is a flow chart of a fabrication process of a memrister in accordance with an exemplary aspect of the present invention.

Now referring to FIG. 2, a flowchart of a process 200 for fabricating a memristor in accordance with an exemplary aspect of the present invention is illustrated. Process 200 is simple and does not involve hazardous materials and complex process.

At step 201, a titanium (Ti) bottom electrode is deposited on a glass substrate. In one aspect of the present invention, step 201 can be realized by different methods of thin film deposition (see FIG. 3 and FIG. 4) which is a vacuum technology for applying coatings of pure materials onto the surface of various objects. The coatings are usually in the thickness of angstroms to microns. In various aspects of the present invention, the coatings can be a single material such as Titanium (Ti) or Chromium (Cr), or multiple materials in a layered structure such as $TiO_y$ oxide and $CrO_x$ oxide. Other deposition techniques such as Physical Vapor Deposition (PVD) including Pulsed Laser Deposition (PLD), thermal evaporation, sputtering, and molecular beam epitaxy (MBE) can also be used to implement step 201.

In many various aspects of the present invention, step 201 is performed by sputtering deposition techniques. Sputtering deposition is a thin-film deposition technique using high energy sputtering of an ionized gas that bombards the surface of a solid metal target inside a vacuum chamber. The sputtered atoms are deposited on the glass substrate to form a thin metal sheet. Sputtering deposition includes DC sputtering, RF sputtering and reactive sputtering. In some preferred aspects of the present invention, step 201 is carried out using the DC sputtering in a vacuum chamber of $7.5 \times 10^{-6}$ Torr. (Torricelli) base pressure. In the vacuum chamber, the anode is connected to the glass substrate, where the Titanium (Ti) electrodes of the memristors are deposited, and the cathode is connected to the Ti target (source). Please see FIG. 3 for the description of the vacuum chamber. First, a shadow mask having predetermined opening patterns for the Ti electrodes is placed on top of the glass substrate. These opening patterns have predetermined geometrical shapes and dimensions. The shadow mask—also known as stencils or deposition mask—is a precision, micromachined sheet by CNC that is used to deposit material onto exact locations on the glass substrate. In many embodiments of the present invention, the shadow mask is a square having a dimension of 20 mm×20 mm, which is also the area of the glass substrate. The openings of the shadow mask has a dog-bone shape whose ends include two square electrodes connected by a connective rectangular strip. The square electrodes at both ends have a dimension of 1.5 mm×1.5 mm, and the connective rectangular strip has a length of 5 mm and a width of 500 microns.

Continuing with step 201, Argon (Ar) sputtering gas acting as incident charged particles are injected into the vacuum chamber so that a working pressure of $3 \times 10^{-3}$ Torr. (3 mTorr.) is achieved. A 100-watt DC voltage is applied between the anode and cathode electrodes of the vacuum chamber. Inside, the Argon gas is ionized into Argon cation ($Ar^+$) and free electrons. Due to the voltage potential between the anode and cathode, the Titanium (Ti) target (source) is bombarded by streams of high-kinetic energy $Ar^+$, dislodging Ti atoms from the Titanium target. The Ti atoms constitute a vapor stream, which traverses the vacuum chamber and hits the substrate, depositing a coating or a thin film. Step 201 forms a thin film of Ti on the glass substrate. The duration of the DC sputtering process is 5 minutes. After that, the shadow mask is removed. The Ti thin films are deposited on the glass substrate with a predetermined shape, pattern, and dimension. The thin films Ti constitute the bottom Ti electrodes (counter electrodes) of the memristor of the present invention.

Next at step 202, a resistive switching layer is deposited. In many aspects of the present invention, step 202 uses reactive sputtering deposition to deposit a compound consisting of a first layer of chromium oxide ($CrO_x$) and a second layer of titanium oxide ($TiO_y$). The same vacuum chamber in step 201 is used. However, in step 202, the anode is connected to the glass substrate where the Cr electrodes are deposited and the cathode is connected to the Chromium (Cr) target. Reactive sputtering involves the injection of argon (Ar) and oxygen ($O_2$) at 80% and 20% ratio into the vacuum chamber. Oxygen ($O_2$) gas reactively assists the formation of metal oxide. The first $CrO_x$ thin film is deposited directly on the Ti bottom electrodes. Again, the vacuum chamber is set to the base pressure of $7.5 \times 10^{-6}$ Torr., and the Argon (Ar) and Oxygen gas are mixed at the ratio of 4:1 (or 80% and 20% respectively) and are introduced into the vacuum chamber at the working (sputtering) pressure of $7 \times 10^{-3}$ Torr. (7 mTorr.). In the presence of oxygen ($O_2$), the free Cr atoms are bonded with O atoms to form Cr—O bonding. This step is continued for 10 minutes until the $CrO_x$ thin film is formed. Step 202 requires 200 W in power supply. Subsequently, the same procedure and parameters are used for the second resistive switching layer $TiO_y$ layer. The $TiO_y$ layer is deposited directly on top of the $CrO_x$ thin film layer. Again, the anode is connected to the glass substrate where the Ti electrodes are deposited. The cathode is connected to the Ti target. Using the same reactive sputtering process, vacuum chamber, and parameters, the Ti—O bonding on top of the chromium oxide ($CrO_x$) thin film layer. In step 202, the amorphous $CrO_x$ is deposited directly onto the Ti bottom electrode. The $TiO_y$ is then deposited directly on the $CrO_x$ layer. In various embodiments of the present invention, chromium oxides ($CrO_x$) include but are not limited to chromium (II) oxide CrO, chromium (III) oxide $Cr_2O_3$, chromium (IV) oxide $CrO_2$, chromium (VI) oxide $CrO_3$, chromium (VI) peroxide $CrO_5$, and $Cr_8O_{21}$, etc. Titanium oxides include but are not limited to titanium (IV) oxide (titanium dioxide) $TiO_2$, Titanium (II) oxide TiO, Titanium (III) oxide $Ti_2O_3$, $Ti_3O_5$, $Ti_4O_7$, and $Ti_5O_9$, etc. In some other embodiments of the present invention titanium oxides $TiO_y$ is represented as $Ti_nO_{2n-1}$, where n=3 to 9. In various embodiments, the $CrO_x$ and $TiO_y$ layers have 1 mm×1 mm square shape.

Next at step 203, after the resistive switching layers are formed, a Chromium (Cr) top electrode is formed. Step 203 is carried out by the sputtering process similar to that of step 201. Again, the anode is connected to the glass substrate where the Cr electrodes are deposited. The cathode is connected to the Cr target. After step 203 is completed, a neuromorphic memristor device with the Cr/$TiO_y$/$CrO_x$/Ti/ glass structure is obtained. The metal oxide is deposited in a 4:1 ratio pressure of Argon:Oxygen sputtering environment. It is noted that steps 202 and 203 require shadow masks to form the exact geometry and dimensions of the Ti bottom electrodes, the $CrO_x$ and $TiO_y$ resistive layers and the Cr top electrode. In many embodiments of the present invention, the shadow mask for step 202 is a square having a dimension of 20 mm×20 mm, which is also the area of glass substrate. The openings include two square electrodes connected by a connective rectangular strip. The square electrodes at both ends have a dimension of 1.5 μm×1.5 μm, and the connective rectangular strip has a length of 5 mm and a width of 500 microns.

After process 200 is completed, the memristor cell of the present invention is formed at the crosspoint of vertical (Ti) and horizontal (Cr) electrodes. The top and bottom electrodes both have the dog bone shape and are deposited orthogonal to each other. Each contacts with 1×1 millimeter resistive switching layers on 5 mm×500 microns connective rectangular strip. The resulting memristor cell has effective dimensions of 500×500 square micrometers ($\mu m^2$). Steps 201-203 and the memristor cells are illustrated in FIG. 3-FIG. 6. It is further noted that in order to get good film adhesion, process 200 requires the glass substrate surface be clean. Appropriate cleaning and handling steps must be employed prior to placing the glass substrates into the vacuum chamber. In addition, it is also required in situ cleaning features such as sputter etch be incorporated into the sputter system.

Figure 3:
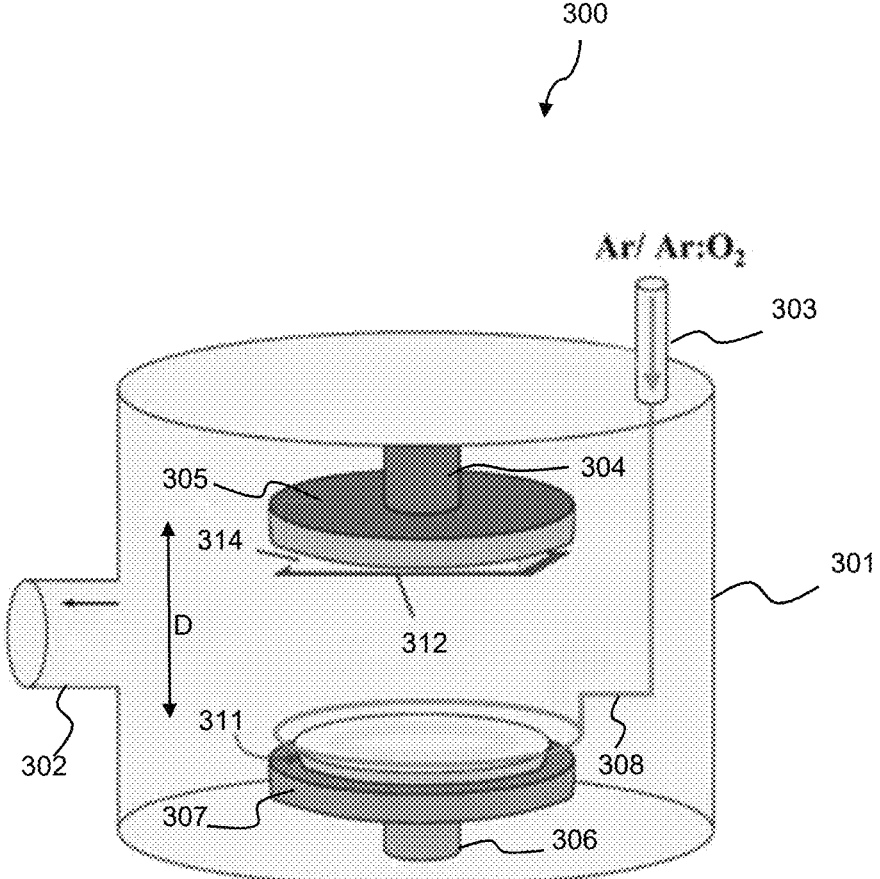
FIG. 3 is a schematic diagram of a vacuum chamber used in the fabrication process of the memristor described in FIG. 2 in accordance with an exemplary embodiment of the present invention.

Next, referring to FIG. 3, a schematic diagram of a magnetron sputtering deposition apparatus 300 ("apparatus 300") used for process 200 is illustrated. In the present invention, apparatus 300 is modified by adjusting a gas tube 308 closer to the target so as to improve the efficiency of process 200.

In many embodiments of the present invention, apparatus 300 includes a main chamber 301, a pressure pump conduit 302, and a gas inlet 303. Inside, apparatus 300 includes a first electrode (e.g., anode) 304 connected to a first base 305 and a second electrode (e.g., cathode) 306 connected to a Continuing with FIG. 3, in some other embodiments, apparatus 300 is configured with various hardware and software options. These include sputter etch or ion source capability for in situ cleaning the surfaces of first base 305, second base 307, substrate 314. Yet in other embodiments, apparatus 300 can include multiple cathodes, confocal arrangement of cathodes, load lock stations and/or substrate handlers, as well as substrate bias capability. Yet in some preferred embodiments, apparatus 300 is equipped with dual magnetron sputtering sources: one for Titanium (Ti), and one for Chromium (Cr). Table 1 summarizes the steps and parameters in apparatus 300 used for process 200.

TABLE 1

Operation Parameters for the Magnetron Sputtering Deposition Device.

| Operation Parameters | Thin Films of The Present Invention | | | |
| --- | --- | --- | --- | --- |
| | Step 201: Ti Layer | Step 202: $CrO_x$ Layer | Step 202: $TiO_y$ Layer | Step 203: Cr Layer |
| Base Pressure | | $7.5 \times 10^{-6}$ Torr. | | |
| Throttled Pressure | | $10^{-4}$ Torr. | | |
| Sputtering Gas | Argon (Ar) | $Ar:O_2 = 80:20\%$ | | Argon (Ar) |
| Working (Sputtering) Pressure | 3 mTorr. | 7 mTorr. | | 3 mTorr. |
| Sputtering Power | 100 W | 200 W | | 100 W |
| Rotation Speed of First Electrode 304 | | 6 rounds per second (rpm) | | |
| Sputtering Time Duration | 5 min | 10 min | | 5 min. |
| Sputtering Temperature | | Room Temperature | | | second base 307. As shown in FIG. 3, first base 305 and second base 307 are positioned opposite to each other. First base 305 and the second base 307 are made of borosilicate and have a circular shape with a respective area of 20 mm×20 mm and 25 mm×25 mm. First electrode 304 and second electrode 306 are electrically connected to power supplies which can be DC or RF. Pump conduit 302 is connected to an external vacuum pump system (not shown). In process 200, main chamber 301 is pumped to a base pressure using a throttled valve (not shown) at the throttle pressure of $10^{-4}$ Torr. But before that, apparatus 300 is cleaned thoroughly with NaOH, acetone, ethanol, purified water, and/or dry cleaning. Before process 200 starts and before main chamber 301 is pumped to a vacuum at the base pressure of $7.5×10^{-6}$ Torr., careful cleaning and handling steps are performed to ensure process 200 effective. A shadow mask 312 is prepared with predetermined shape and dimension. In process 200, shadow masks 312 each have a thickness of 0.3 mm, and openings of 1 mm×1 mm are cut using a CNC machine. Then, it is cleaned with hydrochloric acid (HCl) since main chamber 301, shadow mask 312, and substrate 314 must be ultra clean to get excellent film adhesion. The first electrode 304 and the second electrode 305 are rotatable and adjusted to a distance D of 20 cm, ideal for realizing process 200 of the present invention.

In operation, the Chromium (Cr) vapor, having a purity of 99.95% and the Titanium (Ti) vapor having a purity of 99.2%-99.7% are used. In step 202, the volume ratio between Ti, Ar and oxygen ($O_2$) is 4:1 or 80% to 20%. The working pressure for the gases is 7 mTorr. The supply power between first electrode (e.g., anode) 304 and second electrode (e.g., cathode) 306 are set to 100 W for step 201 and 203 and 200 W for step 202. First base 305 is rotated at 6 rounds per second. Substrate 314 is placed on first base 305. A Cr, Ti targets 311 are placed on second base 307.

Figure 4:
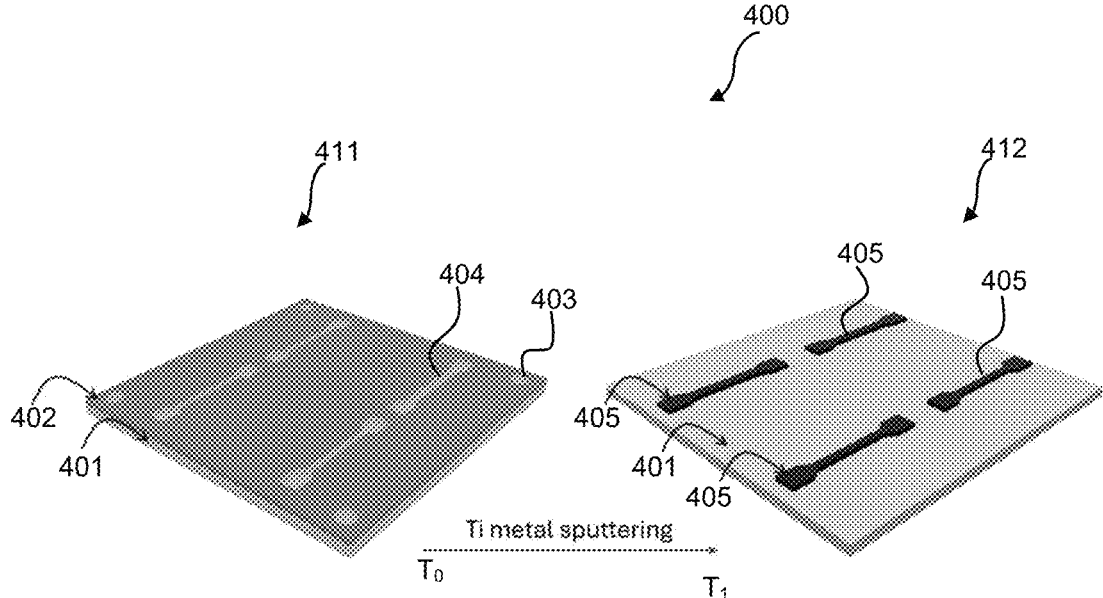
FIG. 4 is a perspective diagram illustrating the first step of the method of FIG. 2 in accordance with an aspect of the present invention.

Next referring to FIG. 4, a perspective diagram showing a memristor cell 400 formed by step 301 of the present invention is illustrated. First, at time $T_0$, a glass substrate 401 of 20×20 millimeters (mm²) is obtained. Then a surface passivation layer 401 with line up holes 402 and openings 403 is deposited directly on top of glass substrate 401. A shadow mask 403 can be metal alloys such as thin stainless steel or other types of metal alloys such as nickel. Shadow mask 403 is a precision, micro machined sheet cut by a CNC machine to include openings 404 with precise shape, location, and dimension. Shadow mask 403 is also known as stencils or deposition mask. At time $T_1$, a Titanium (Ti) having a purity of 99.7% is deposited directly on top of the glass substrate 401 using DC sputtering deposition method 200 and apparatus 300. In other embodiments of the present invention, various thin film depositing methods, such as pulse laser deposition (PLD), can be used to form bottom electrode 405. Argon sputtering gas is injected into main chamber 401 at the working (sputtering) pressure of $3×10^{-3}$ Torr (3 mTorr.). A voltage supply power of 100 W VDC is applied between the first electrode 304 and the second electrode 306 of the main chamber 301; the Ti atoms migrate from target 307 and deposit on a glass substrate 314. The sputtering time is 5 minutes and the sputtering temperature inside main chamber 301 is room temperature. After step 201 is completed, Ti bottom (counter) electrode 405 is formed according to openings 404. As alluded above, openings 404 have the dog bone shape whose dimensions and thickness are provided above.

Figure 5:
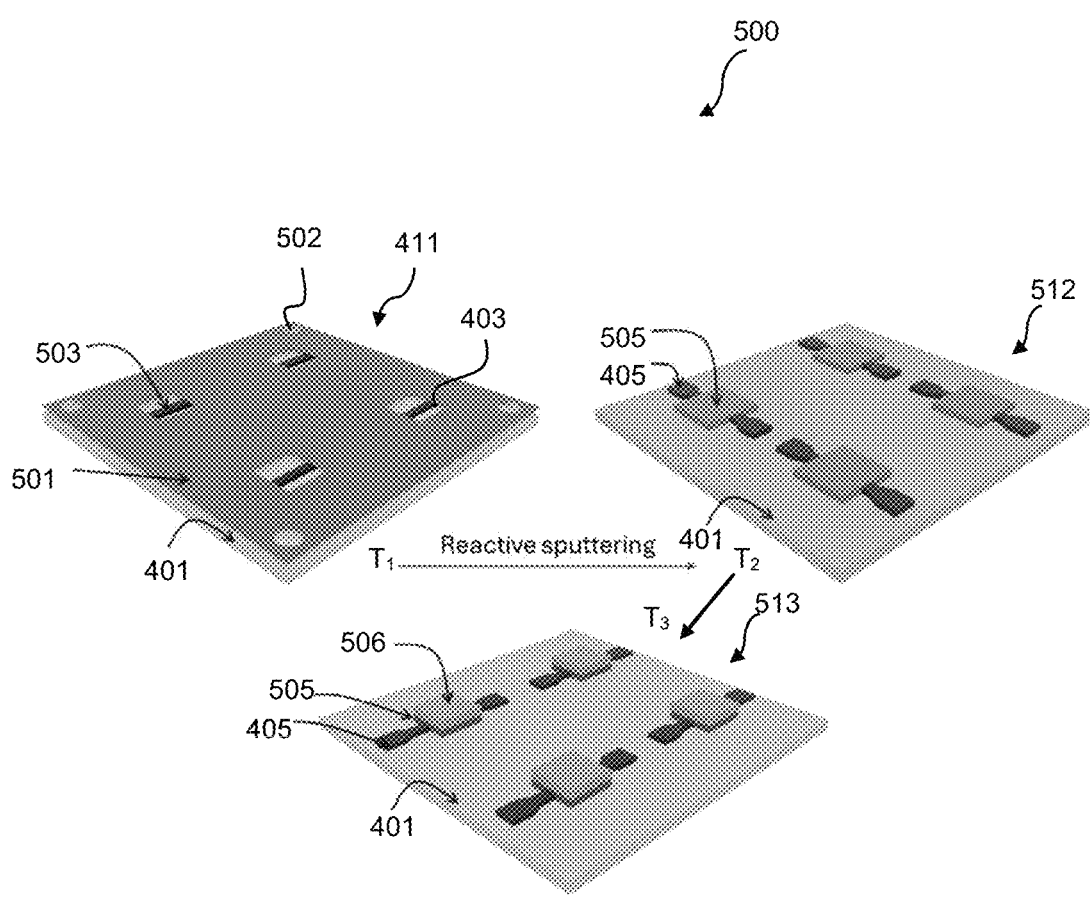
FIG. 5 is a perspective diagram illustrating the second step of the method of FIG. 2 in accordance with an aspect of the present invention.

Referring next to FIG. 5, a perspective diagram showing a memristor cell 500 formed by step 202 of the present invention is illustrated. In many embodiments of the present invention, a first layer of chromium oxide ($CrO_x$) 505 and a second layer of titanium oxide ($TiO_y$) 506 are deposited directly on top of the bottom Ti bottom electrode 405. In other various embodiments of the present invention, other metal oxides having similar electrical characteristics to those of $CrO_x$ and $TiO_y$ can be used. After Ti electrode 405 is formed at time $T_1$, A first shadow mask 501 with lining up holes 502 and openings 503 is laid on top of the glass substrate 401 and Ti bottom electrode 405. Openings 503 has the square shape and dimension of the $TiO_y$ resistive layer, which is described above. Then, at time $T_2$, $CrO_x$ layer 505 is deposited directly on top of $TiO_y$ resistive electrode 405 by a reactive sputtering method using apparatus 300. During the reactive sputtering process, the vacuum chamber is set to a base pressure of $7.5 \times 10^{-6}$ Torr, and the Argon (Ar) and Oxygen ($O_2$) gases are mixed at the ratio of 4:1 or 80% to 20%. These gases are introduced into the vacuum chamber at the working (sputtering) pressure of 7 mTorr. In the presence of oxygen, the injected Cr is bonded with O atoms to form Cr—O bonding. The realization of step 202 is continued for 10 minutes until chromium oxide ($CrO_x$) layer 405 is formed on each of Ti bottom electrodes 305. This step of sputtering requires 200 W of power to be applied between the first electrode 304 and the second electrode 306.

Continuing with FIG. 5, at time $T_3$, the second resistive $TiO_y$ layer 506 is deposited on top of $CrO_x$ layer 505. The same reactive sputtering process 200 using apparatus 300 is used. The realization of step 202 results in amorphous $CrO_x$ resistive layer 505 and $TiO_y$ resistive layer 506.

Figure 6:
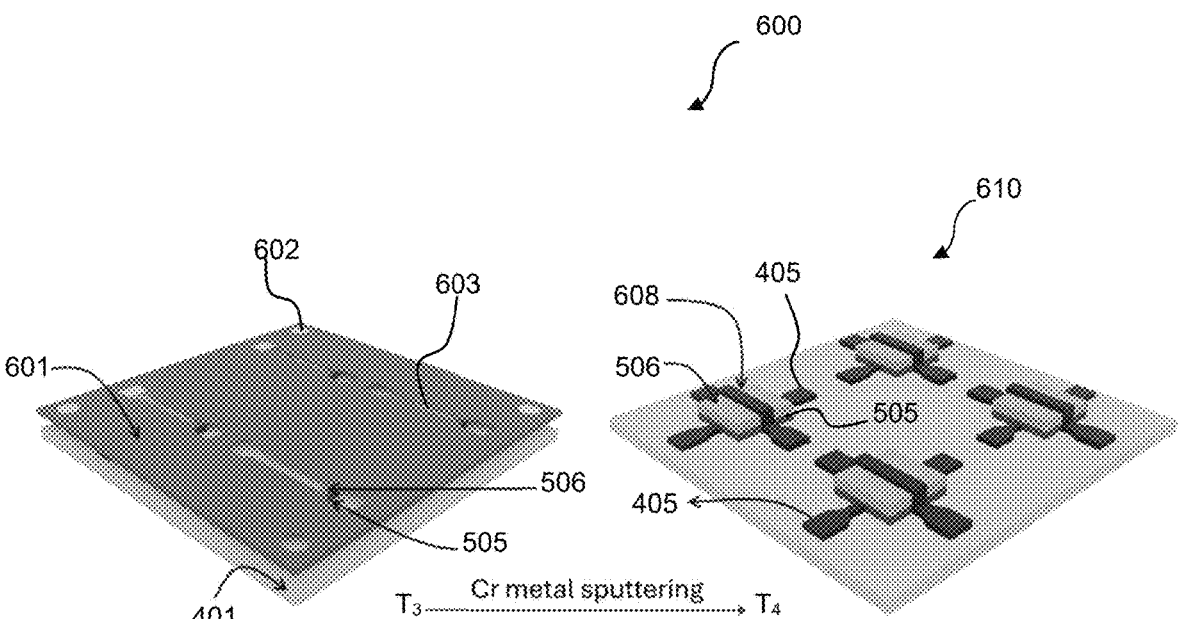
FIG. 6 is a perspective diagram illustrating the third step of the method of FIG. 2 in accordance with an aspect of the present invention.

Next referring to FIG. 6, a perspective diagram showing a memristor cell 600 formed by step 303 of the present invention is illustrated. After the resistive switching layers are formed at time $T_3$, a Chromium (Cr) top electrode 608 is formed. Step 203 is carried out by a sputtering process similar to that of step 201. After step 203, at time $T_4$, a neuromorphic memristor device 610 with the $Cr/TiO_y/CrO_x/$ Ti/glass structure is obtained. As alluded above, the metal oxide ($TiO_y/CrO_x$) is deposited in a 4:1 ratio of Argon/ Oxygen sputtering environment.

In operation, memristor 610 consists of a storage layer ($CrO_x$ oxide 505 and $TiO_y$ oxide 506) is inserted between the top electrode Cr 508 and bottom Ti electrode 405, which can undergo dynamic reconfiguration within the storage layer with the application of electrical stimuli, resulting in resistance modulation referred to as memory effect.

The changed resistance state can be retained even after electrical inputs are removed. Memristor 610 is based on the history of applied electrical stimuli. These capabilities lead to analog switching, which resembles biological synapses where the strength (or synaptic weight) can increase or decrease depending on the applied external voltage or electrical fields. The $O^{2-}$ ions migrate toward the cathode or top electrode 608. This anion motion causes a change in the valence state of the cation to keep the charge neutral. Throughout the process, the oxygen vacancies continue to form pathways in the storage layer. When the pathways reach the top Cr electrode 608 and bottom Ti electrode 405, current flows through the pathways, with the result that memristor 610 switches to ON state. Contrastingly, when a negative voltage is applied to top Cr electrode 608, the $O^{2-}$ ions either recombine with oxygen vacancies present in the pathways or oxidize the cation precipitates, with the result that memristor 610 switches to OFF state. In addition, representative characteristics such as the linearity in weight update, multilevel states, dynamic range (ON/OFF ratio), variation, retention, endurance, Schottky barrier diode (SBD), and footprint are also obtained. The linearity of the weight update indicates the linear relationship between weight change ($\Delta w$) and programming pulse. In other words, the conductance of memristor 610 changes linearly in accordance with the number of programming pulses, which is associated with the mapping of weight in the algorithms for conductance in memristor 610. Hence, the linearity of weight update affects the performance (e.g., accuracy). Last but not least, the footprint of memristor 610 is below sub-10 nm because high density leads to more synaptic devices that store learned information under a specific area.

The electrical behaviors of memristor 610 can be explained by the bandgap model. Under the bandgap model, the properties of $CrO_x$ and $TiO_y$ oxides 505 and 506 are closely related to semiconducting properties and the associated defect disorders. The defect disorder of $CrO_x$ and $TiO_y$ oxides 505 and 506 involves a variety of ionic point defects such as Oxygen vacancies and interstitial vacancies. Moreover, $CrO_x$ and $TiO_y$ oxides 505 and 506 are found to involve both types of electronic defects: electrons and holes. These mobile carriers are formed by the ionization of ionic defects. The ionic defects exhibit different degrees of ionization. The defect disorder of $CrO_x$ and $TiO_y$ oxides 505 and 506 includes fully ionized defects, as well as electronic defects located on the lattice sites.

The effect of electrical stimuli on the properties of semiconductors depends mainly on its bandgap, which is the difference of energy between the top of the valence band and the bottom of the conduction band. The valence bands of $CrO_x$ and $TiO_y$ oxides 505 and 506 are formed by filled $2p$ orbitals of two valent oxygen ions and the conduction band is formed by empty 3d states of four-valent Ti, Cr ions. One of the important parameters in electronic structure is Fermi level, which is the parameter is the Fermi-Dirac function $F(E)$ that is given as:

$$F(E) = \cfrac{1}{1 - \exp\left(\cfrac{E - E_F}{kT}\right)};$$

where $E_F$ is the Fermi energy level, k is Boltzmann constant and T is temperature.

The charge transfer takes place when the couple components enter into galvanic contact. This leads to the diffusion of electrons from p-type to n-type component and the diffusion of electron holes in opposite directions. The diffusion results in the formation of an electrical potential barrier that is determined by the difference in the Fermi levels. The resulting electric field is reflective of band bending within the depletion zone. Ultimately there is no net charge transfer across the interphase if the system is in thermal equilibrium. The related electric field is the driving force of charge separation when the system is exposed to electrical stimuli, leading to bandgap ionization. Therefore, the barrier formed across the junction may be considered an electrochemical pump for the transfer of the electronic charge carriers in the desired direction. The band model representing the effect of electrical stimuli on the charge transfer across the chain involving the couple formed of metallic islets deposited on the Fermi level is the collective property related to the chemical potential of electrons, which is reflective of the ability of a semiconductor either to accept or donate electrons. The Fermi level of memristor 610 is a complex function of the defect disorder and the ionization degree of all defects involved. The reactivity of semiconductors is influenced by the Fermi level, which is the collective factor, and the local factor that depends on the nature and the concentration of surface active sites.

For the above properties, memristor 610 of the present invention exhibits Schottky barrier diode (SBD) behaviors at the junctions Ti/CrO$_x$ and Cr/TiO$_y$. The SBD characteristics of memristor 610 achieve the objective of eliminating cross-talks and unwanted signals in the HRS. Please refer to FIG. 12-FIG. 13.

Device Microstructure and Characterization

Figure 7:
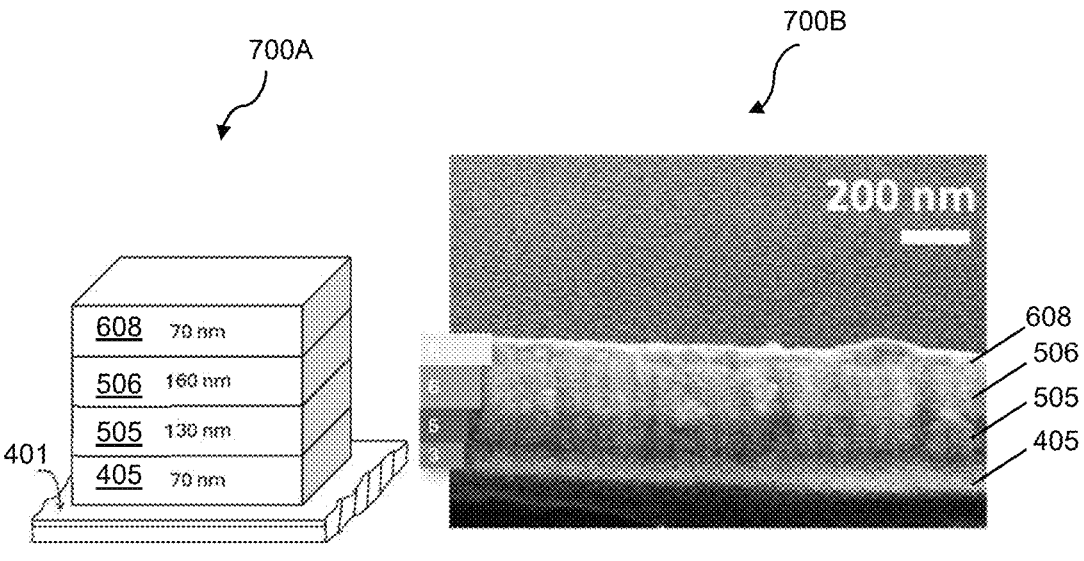
FIG. 7A is a perspective diagram of the layers of the memristor in accordance with an embodiment of the present invention.
FIG. 7B is a picture of the layers of the memristor formed by method 200 of the present invention taken by a Field Emission Scanning Electron Microscope (FE-SEM)

Now referring to FIG. 7A, an isometric diagram of the layers representative of a section of a memristive cell 700A is illustrated. From bottom to top, the memristor cell is deposited on a glass substrate 401. In various embodiments of the present invention, memristor cell 610 consists of a Ti bottom electrode 405 with a thickness 50 nm to 150 nm, preferably 70 nm; a resistive CrO$_x$ layer 505 having a thickness of 130 nm; a second resistive TiO$_y$ layer 506 having a thickness of 160 nm; and a top Cr electrode 608 having thickness between 50 nm to 150 nm, preferably 70 nm In many preferred embodiments of the present invention, these layers are deposited directly on top of one another following the order illustrated in FIG. 7A.

Now referring to FIG. 7B, in the material characterization, a picture 700B showing the thicknesses of the memristor of the present invention measured using the FE-SEM model of Hitachi SU8000 in-line is illustrated. The layers are shown on the surface of a thin film using an Atomic Force Microscope (AFM) with Park NX10 System. In the following graphs, the current-voltage graphs were plotted with resistive switching data to confirm a resistive switching characteristic using the Keithley 4200 SCS 300 system. FIG. 7B shows the junction structure consists of Ti/CrO$_x$ (~130 nm)/TiO$_y$ (~160 nm)/Cr layers 505 and 506, respectively. The thickness of 70 nm for Ti and Cr electrodes 405 and 608 provided a good resistance of 100 Ohm/sq for device operation.

A voltage was applied between top Cr electrode 508 and bottom Ti electrode 405. The bottom Ti electrode is grounded. All measurements were performed in the air and at room temperature. The voltage-current (VI) characteristics of the current (indicated by measured as a voltage of the device (indicated by V) is gradually increased from 0 V, then gradually reduced after reaching +V$_{max}$, and then gradually increased after reaching −V$_{max}$, and finally reduced to −V$_{max}$ to reach 0 V. Graphs 900A to 900E show the V-I characteristics of the memristor 512 of the present invention under different biasing currents ranging from 1 V to 5 V.

Figure 8:
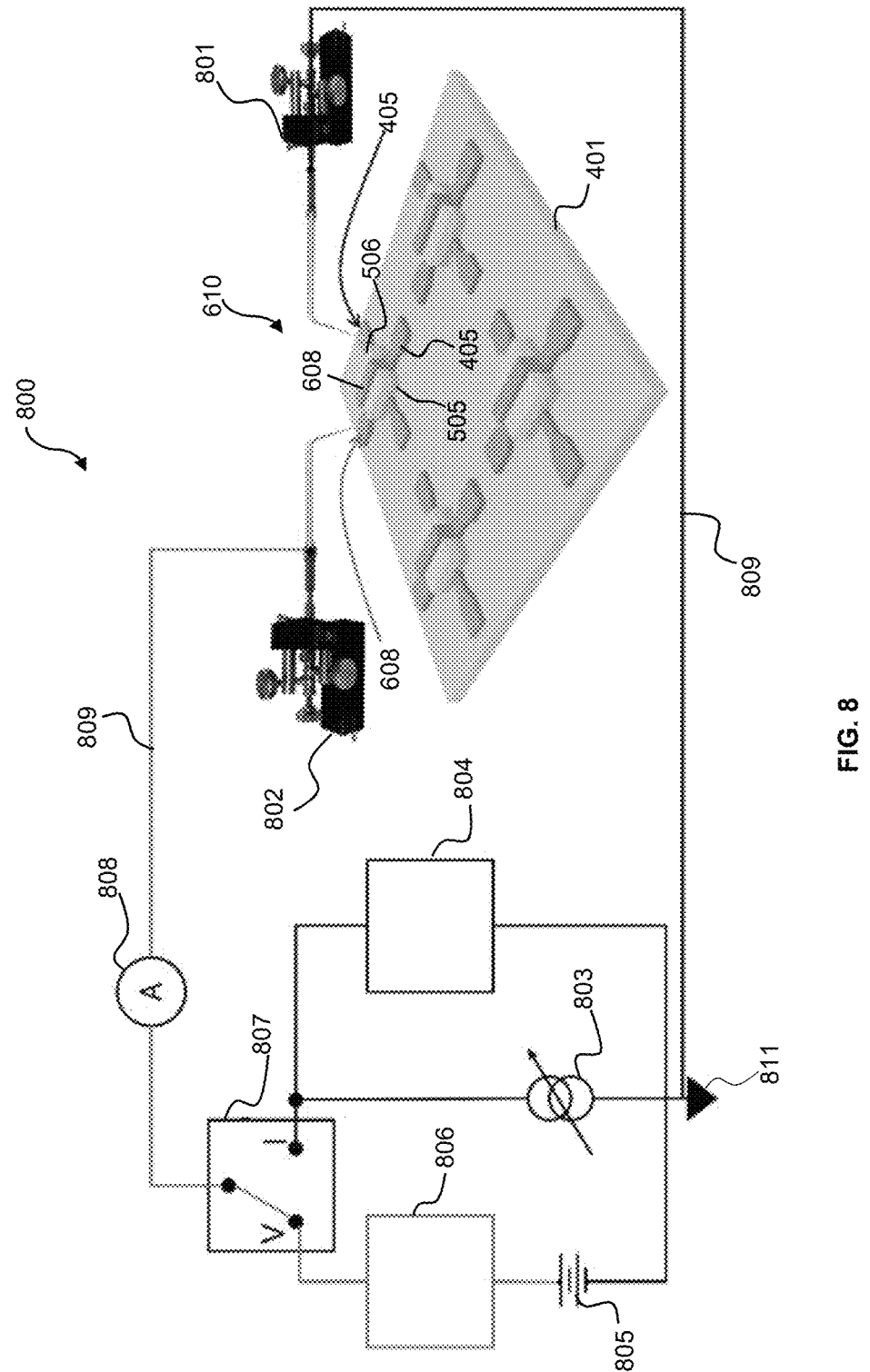
FIG. 8 is a schematic diagram of a test setup designed to obtain electrical characteristics of the memristor of the present invention.

Next referring to FIG. 8, a schematic diagram of a test setup 800 designed to obtain electrical characteristics of the memristor of the present invention is illustrated. Test setup 800 is designed to test memristor 610 obtained by process 200 above. A first coupler 801 is connected to the bottom Ti electrode 405 and a ground 811. A second coupler 802 is coupled to the top electrode Cr 608 and to an ammeter 808. A current source 803 is connected to the first terminal of a switch 807 and a first current limiter 804. The second terminal of switch 807 is connected to a second voltage limiter 806 and to voltage source 805. The output of switch 807 is connected to ammeter 808. First coupler 801 and second coupler 802 are connected to measuring instruments such as oscilloscopes or spectrum analyzer to obtain the I-V results of memristor 610. These results are shown in FIG. 9 to FIG. 14.

Figures 9A, 9B, 9C, 9D, 9E:
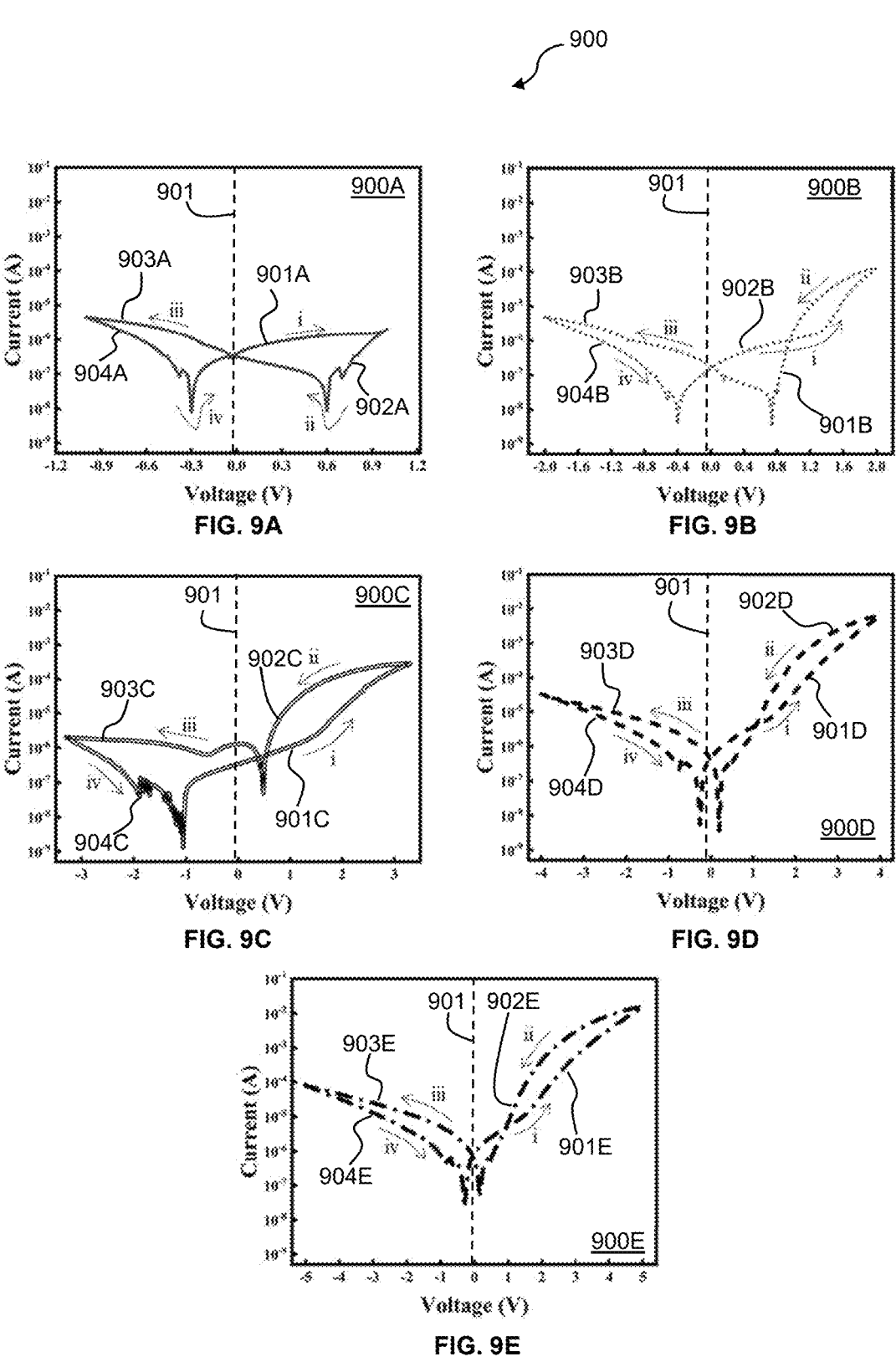
FIG. 9A-FIG. 9E illustrate the voltage-current (V-I) of the memristors with bias voltages from −2V to 2V in accordance with exemplary embodiment of the present invention.

Now referring to FIG. 9A shows a graph 900A plotting an experimentation V-I switching characteristics for CrO$_x$/TiO$_y$ memristor 610 for different magnitudes of sweeping voltage (V) from 1 to 5 V. It is noted that memristor 610 under test is obtained from method 200 and illustrated in FIG. 5 above. Graph 900A shows the hysteresis of the V-I curve consisted of zero voltage line 901, a first curve 901A from 0 V to 2 V, a second curve 902A from 2 V to 0 V, a third curve from 0 V to −2 V 903A, and a fourth curve 904A from −2 V to 0 V. The arrows in FIG. 9A indicates the change in current under 1 V bias. Under this biasing condition, memristor 610 is still in an insulate state, i.e., cutoff or OFF state. This implies that the generated electric field is not strong to cause any charge flow in the stackable CrO$_x$/TiO$_y$ layer. In other words, 1 V bias is insufficient for memristor 610 to operate. It is noted that graphs 900A-900E are V-I graphs with the horizontal axis representing the voltage (V) and the vertical axis representing the current (A) (I).

Next, in FIG. 9B, an V-I graph 900B shows the difference in behavior when the biasing voltage is 2 V. Graph 900B shows the hysteresis of the V-I curve consisted of zero voltage line 901, a first curve 901B from 0 V to 2 V, a second curve 902B from 2 V to 0 V, a third curve from 0 V to −2 V 903B, and a fourth curve 904B from −2 V to 0 V. Graphs 900B shows the analog switching result in which a current flow gradually increases to 10$^{-4}$ A when positive sweep voltages correspond to a forward bias curve 901B from 0 V to 2 V. This implies that the resistance state of the device (R=U/I) has transitioned from a high resistance state (HRS) to a low resistance state (LRS), which turns ON memristor 610. By V-I sweeping backward in direction of 0 V to −2 V shows in third curve 903B, a behavior of gradually reducing current is shown. This is clearly an analog switching characteristic.

All measurements on graph 900B at 2 V bias show asymmetric bipolar (self-rectifying) switching behavior controlled by different bias polarities without any formation process, which resembles the typical switching curve of one-diode-one-resistor (1D-1R) memory devices. In the negative voltage region, the switching current of the device can be suppressed based on the rectifying property of the Schottky barrier diode (SBD) at Ti/CrO$_x$ junction. Third curve 903B shows that the current level is roughly maintained (≈10$^{-5}$ A) regardless of programming voltage variation from 2 to 5V.

Next referring to FIG. 9C, an V-I graph 900C shows that the hysteresis window between forward current curve 902C and reverse current curve 903C widens as bias voltage increases to 3.25 V. Graph 900C shows the hysteresis of the V-I curve consisted of zero voltage line 901, a first curve 901C from 0 V to 2 V, a second curve 902C from 2 V to 0 V, a third curve from 0 V to −2 V 903C, and a fourth curve 904C from −2 V to 0 V.

FIG. 9D illustrates a V-I graph 900D when the bias voltage is at 4 V. As seen, the hysteresis windows between a second curve 902D and a third curve 903D quickly narrow. Graph 900D shows the hysteresis of the V-I curve consisting of zero voltage line 901, a first curve 901D from 0 V to 2 V, second curve 902D from 2 V to 0 V, third curve from 0 V to −2 V 903D, and a fourth curve 904D from −2 V to 0 V.

Similarly, FIG. 9E illustrates an V-I graph 900E when the bias voltage is at 5V. As seen, the hysteresis windows between second curve 902E and a third curve 903E quickly narrow. Graph 900E shows the hysteresis of the V-I curve consisting of zero voltage line 901, a first curve 901E from 0 V to 2 V, second curve 902E from 2 V to 0 V, third curve from 0 V to −2 V 903E, and a fourth curve 904E from −2 V to 0 V.

As observed in FIG. 9A-FIG. 9E, different bias voltages reflect different charge-trapping abilities. Accordingly, the self-rectifying behavior of memristor 610 influences. Generally, memristor 610 of the present invention exhibits optimized behaviors in both hysteresis windows and self-rectifying performance when 3.25 V biasing voltage is applied.

Figure 10:
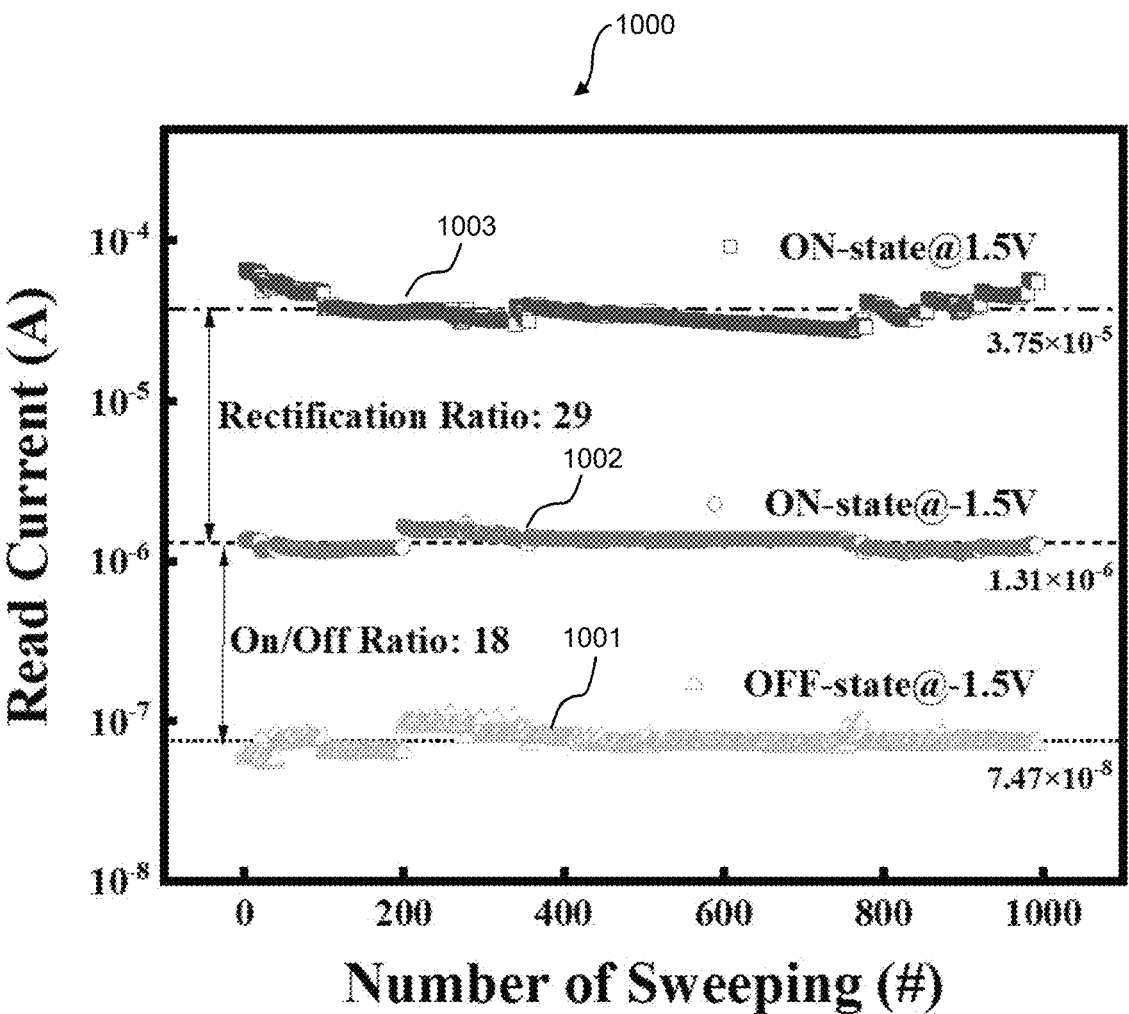
FIG. 10 is a graph of the current vs. number of sweeping of the memristor in accordance with an exemplary embodiment of the present invention.

Next referring to FIG. 10, a graph 1000 of read current vs. number of sweeping is illustrated. Graph 1000 shows ON-OFF Ratio whose data are extracted from the V-I graphs 900A-900E above. Graph 1000 illustrates the read current (defined as $V_{read}=V_{operating}/2$) for the LRS (designated as ON-state@-1.5 V) and HRS (denoted by OFF-state@-1.5 V) at a −1.5 V bias. A graph 1001 shows an OFF-state at −1.5 V or a high resistance state (HRS). A graph 1002 shows an ON-state at −1.5 V, or a low resistance state (LRS). A graph 1003 shows an ON-state at 1.5 V. This observation implies that stable differentiation between HRS and LRS states is achievable within a reliable operational range. On average, over 1,000 tests, the current (I in A) exhibits an 18-fold difference.

Figure 11:
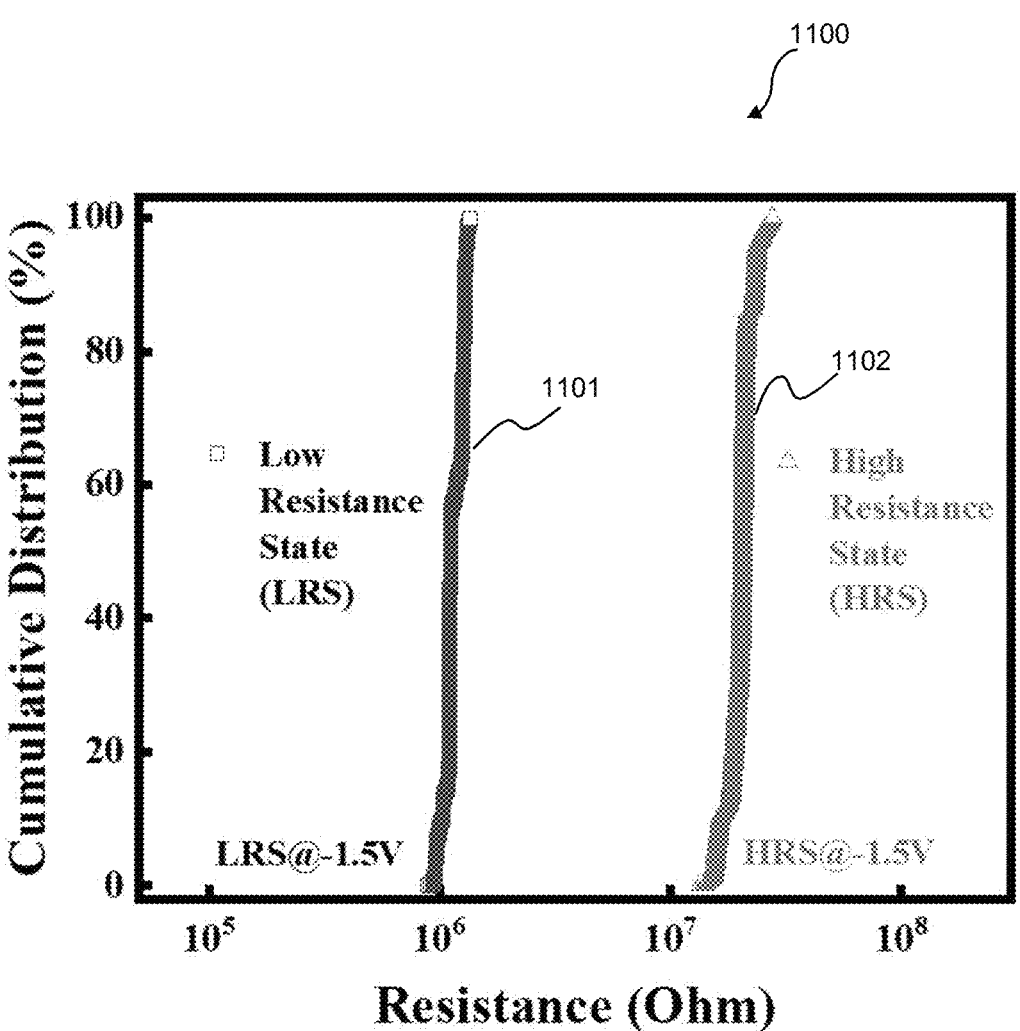
FIG. 11 illustrates the cumulative distribution of the resistance for high resistance state (HRS) and a low resistance state (LRS) of the memristor in accordance with an exemplary embodiment of the present invention.

Next, in FIG. 11, a graph 1100 illustrates the cumulative distribution of resistance values for HRS and LRS at −1.5 V across 1,000 extracted read currents. A HRS graph 1102 exhibits resistance values within the range of 13.53-27.71 MΩ. Graph 902 shows minimal variation throughout the tests. Similarly, LRS graph 1101 maintains relatively consistent resistance which fluctuates between approximately 8.79 MΩ and 1.35 MΩ with little change observed during the examination. This significant difference in resistance values between graph 1101 and graph 1102 reaffirms the stable differentiation between HRS and LRS.

Continuing with FIG. 11, graph 1102 represents the current in the positive region (denoted by $|I_{LRS}|@+1.5V$), and graph 1101 represents the current in the negative region (indicated by $|I_{LRS}|@-1.5V$) are shown. The average current values are $3.75\times10^{-5}$ A and $1.31\times10^{-6}$ A, respectively, for $|I_{LRS}|@+1.5V$ and $|I_{LRS}|@-1.5V$. The average rectification ratio, expressed as $(|I_{LRS}|@+1.5V)/(|I_{LRS}|@-1.5V)$, amounts to 29.

Synaptic Performance

The multiple switching conductance of the $CrO_x/TiO_y$-based memristor 610 is controlled by the input voltages and is used as variable synaptic weights in the neural networks. Following this, synaptic sweeping was conducted positively for 5, 15, or 30 times, then shifted to the negative bias.

Figure 12:
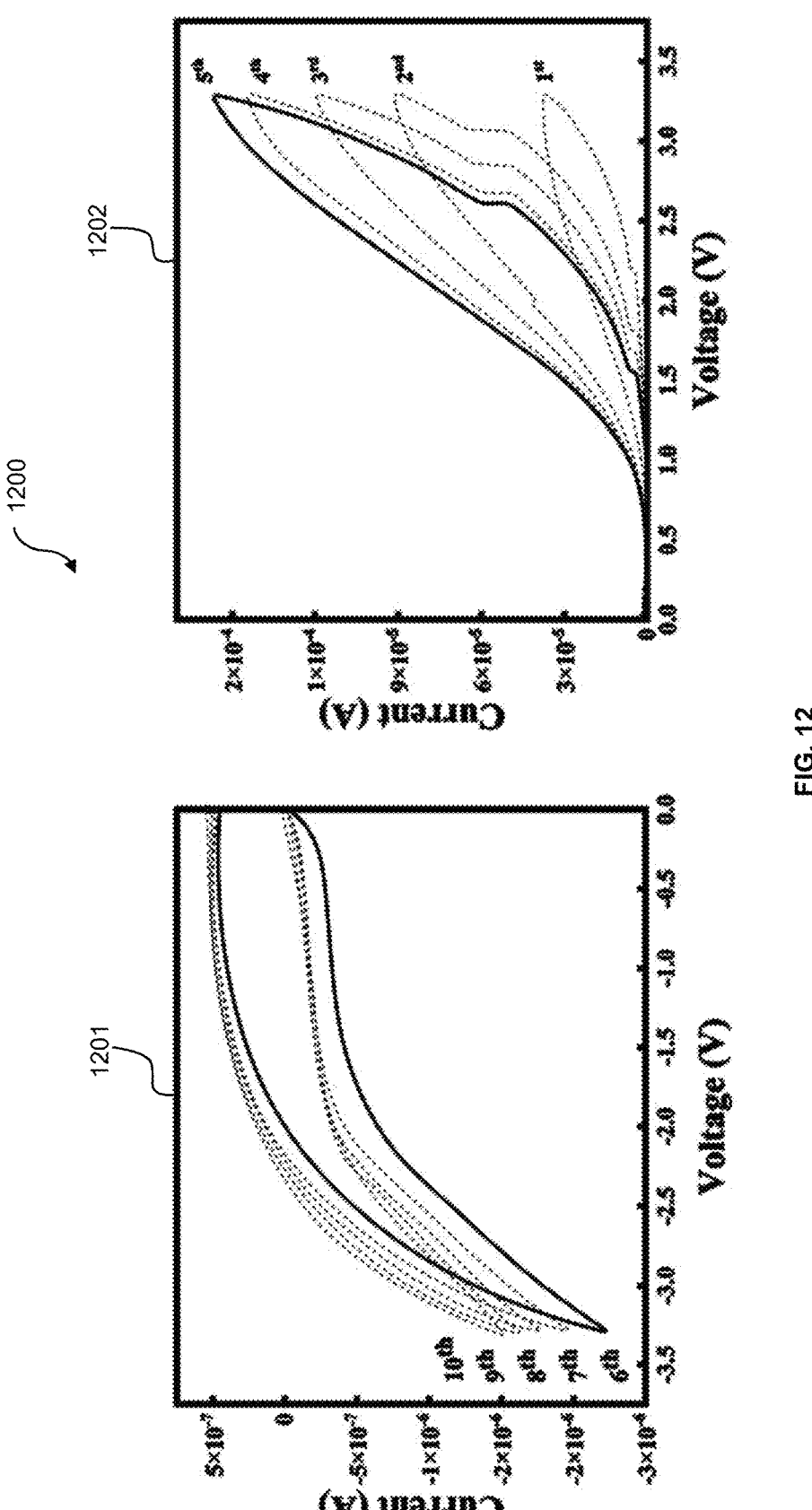
FIG. 12 illustrates the graphs of currents versus sweeping voltages from −3.5V to 0V of the memristor in accordance with an exemplary embodiment of the present invention.

Now referring to FIG. 12, bias voltage varies from 0 V to 3.25 V was observed. When the bias voltage sweeps in a region from 0.0 V to 3.5 V, a graph 1001 is obtained. Graph 1201 plots out a series of curves, each representing a sweeping voltage. There are five curves from the first sweep to the fifth sweep. In graph 1201, it is observed that the higher the number of sweeps, the current of memristor 610 gradually increases from $3.75\times10^{-5}$ A at the first sweep to $1.57\times10^{-4}$ A (read current at $V_{max}$). This behavior represents the potentiation process of the biological synapse. Potentiation is the increase in strength of nerve impulses along pathways that have been used previously, either short-term or long-term. In other words, graph 1201 shows that the more sweeping signals are applied, the stronger the memory. This is analogous to reinforcement learning. The more one reviews or studies, the longer the memory.

When the bias voltage sweeps from 0 to −3.25 V, a graph 1202 is obtained. In graph 1202, it is observed that the current exhibits a slight decrease from $2.26\times10^{-6}$ A at the 6th sweep to $1.50\times10^{-6}$ A at the tenth sweep. This current is notably lower compared to the positive bias sweeps, indicative of the rectifying behavior. Such behavior signifies the depression process of the synapse. Depression is the process of reduction in the efficacy of neuronal synapses that last hours or longer. The depression behavior shown in graph 1202 means that memristor 610 of the present invention rectifies (1) weak synaptic signals and (2) the reverse signals traveling from the opposite direction with the original synaptic signals.

Figure 13:
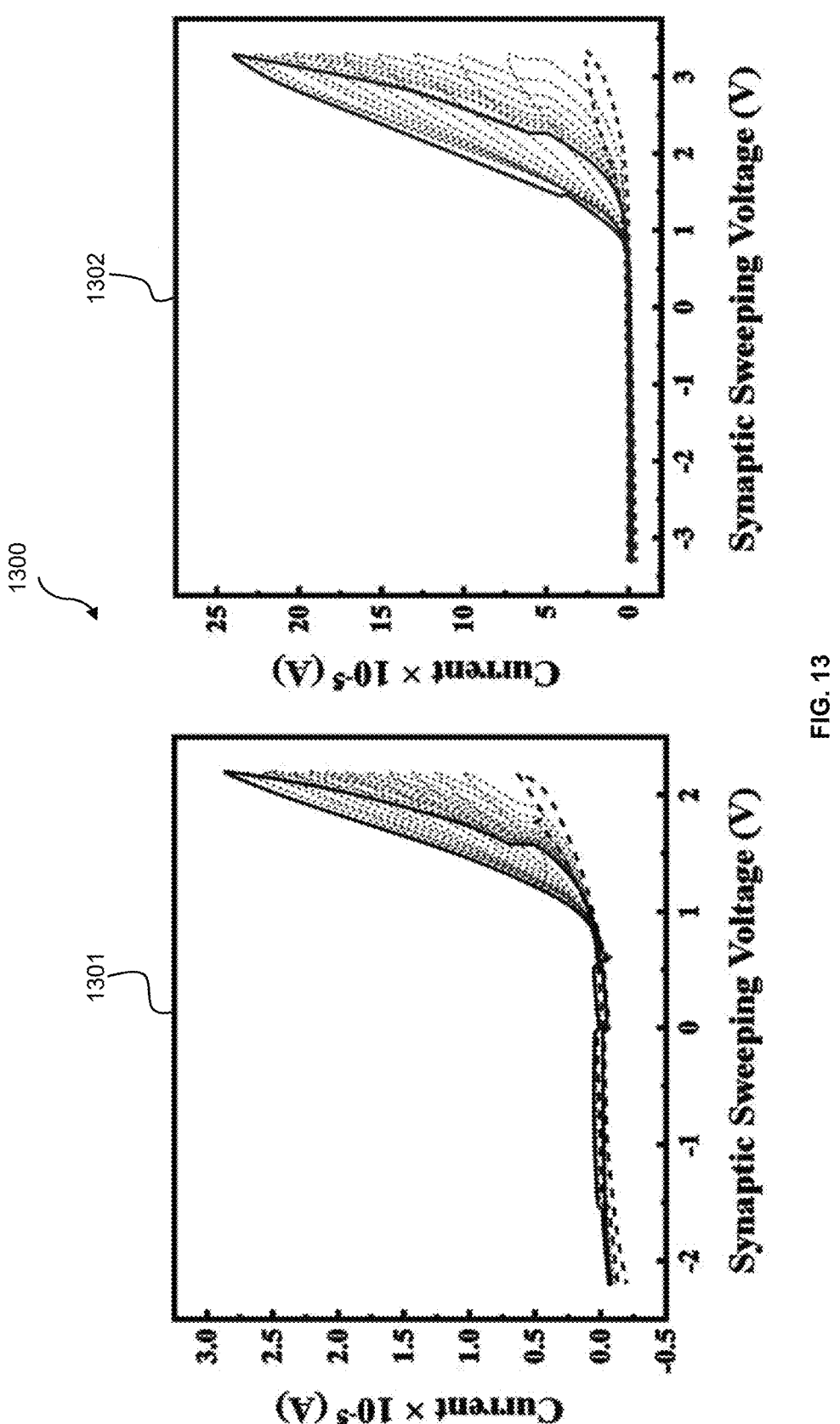
FIG. 13 illustrates the graphs of currents vs synaptic sweeping voltages from −2.0V to 3.25V of the memristor in accordance with an exemplary embodiment of the present invention.

Referring next to FIG. 13, a graph 1300 plots the same experimentation as in FIG. 12 at 15 sweeps in regions of 2.25 V and 3.25 V, respectively. Graph 1301 plots current vs. synaptic sweeping voltage from −2V to 2V. Graph 1302 plots current vs. synaptic sweeping voltage from −3 V to 3 V. Both graphs 1301 and 1302 consistently show the knee voltage at 1 V and confirm the potentiation and depression of memristor 610. The outcomes demonstrate a clear voltage-dependent synaptic behavior under various input voltages. Specifically, FIG. 13 reveals that the current reached higher levels after 15 sweeps compared to 5 sweeps.

Figure 14:
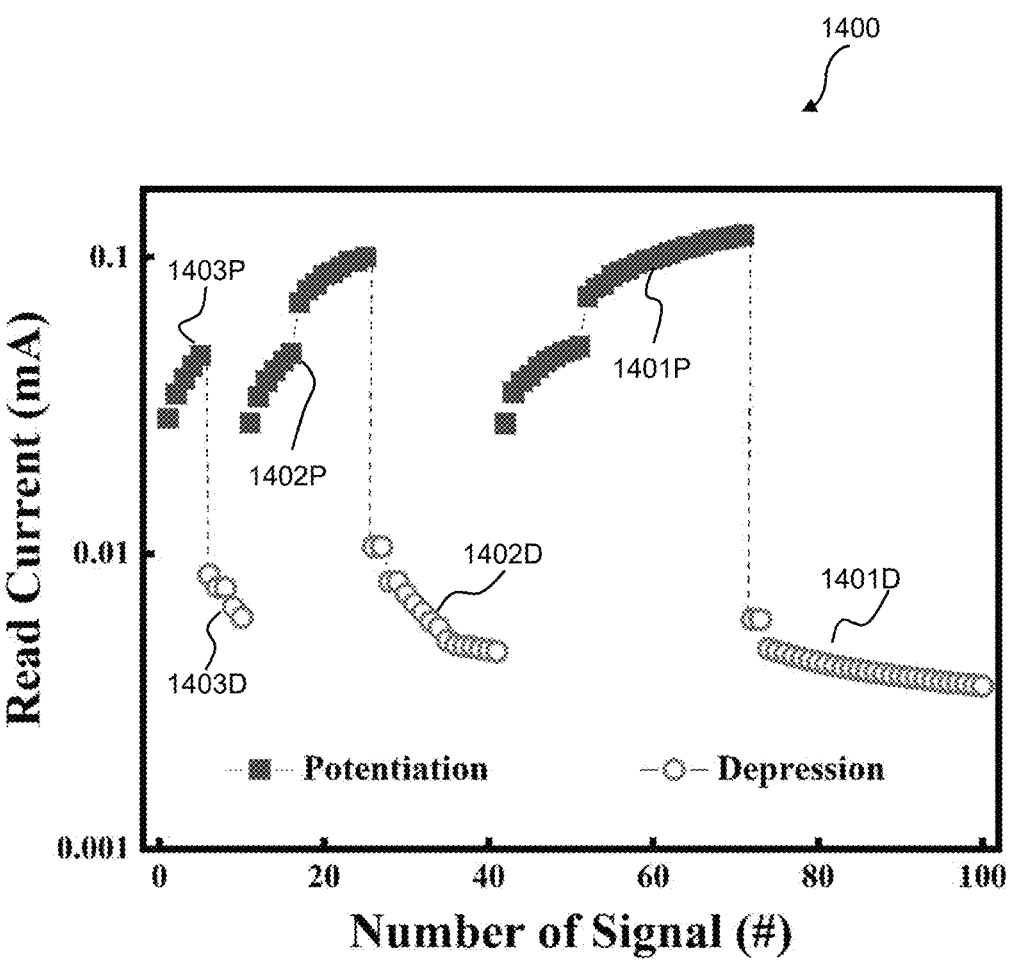
FIG. 14 illustrates the graphs of currents vs the number synaptic sweeping voltages showing memory capacity of the memristor in accordance with an exemplary embodiment of the present invention.

FIG. 14 shows a graph 1400 of the output current of the memristor of the present invention for 5, 15, and 30 sweeping signals. A cluster 1401D represents depression at 5 sweeps. A cluster 1401P represents potentiation at 5 sweeps. Similarly, a cluster 1402D represents a cluster of depression at 15 sweeps, while 1402P represents potentiation at 15 sweeps. Finally, a cluster 1403D represents depression for 30 sweeps, and a cluster 1403P represents a cluster of potentiation at 30 seeps. These plots confirm that resistance against potentiation and depression electric pulses was gradual and linearity increased by 5, 15, and 30 times of repeated applications of potentiation electric pulses of +3.25 V 500 ms (also the read current). In addition, a depression behavior in which resistance is linearity reduced is exhibited by applying depression electric pulses of −3.25 V.

From the above, it evidences that memristor 610 of the present invention can effectively control resistive switching with analog behavior, demonstrating asymmetry and enhanced endurance in comparison to the prior-art memristor devices. Consequently, the memristor device fabricated according to the present invention exhibits improved neuromorphic characteristics.

In addition, memristor 610 of the present invention comprises a resistive switching layer that includes a stackable $CrO_x/TiO_y$ layer with a Schottky contact at the $Ti/CrO_x$ interface.

Neural Network Array Built on $Ti/CrO_x/TiO_y/Cr$ Memristor of the Present Invention FIG. 2-FIG. 14 above shows that $Ti/CrO_x/TiO_y/Cr$ memristor 610 of the present invention shows all electrical characteristics that can reliably be used in neural network circuitry.

Figures 15A, 15B:
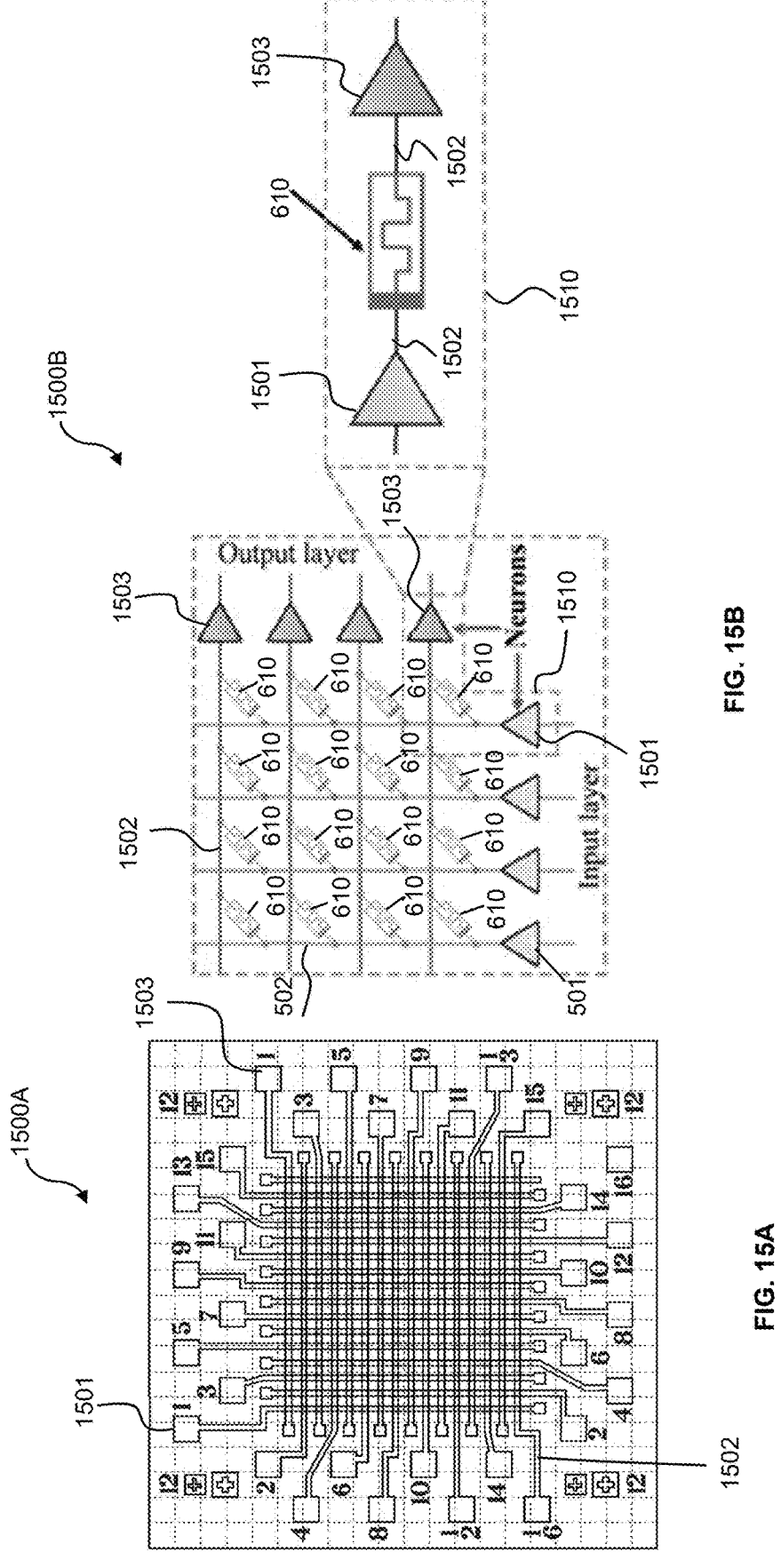
FIG. 15A illustrates a 16×16 neural network array using the memristor of the present invention described in FIG. 2-FIG. 14.
FIG. 15B illustrates a schematic diagram of the N×M neural network array of FIG. 15A in accordance with an exemplary embodiment of the present invention.

Now referring to FIG. 15A, a photograph of an N×M neural network 1500A using memristor 610 in accordance with an exemplary embodiment of the invention is illustrated. N×M neural network 1500A has an array of N input circuitry 1501, an M array of output circuitry 1503 that form a matrix where a plurality of $Ti/CrO_x/TiO_y/Cr$ memristors 610 are situated at the crosslines of transmission lines 1502. In a particular embodiment of the present invention, N and M are 16 and this 16×16 neural network was fabricated using 200 μm microelectromechanical systems (MEMS) fabrication process.

Referring now to FIG. 15B, a schematic diagram 1500B representative of 16×16 neural network 1500A is illustrated. Schematic diagram 1500B is self-explanatory with a blowup section 1510. Blowup section 1510 shows input circuitry

1501 and output circuitry 1503 arranged in a 16×16 array (or matrix) formation. In the 16×16 embodiment, the area of the glass substrate is 25 mm×25 mm. The dimensions of each memristor 610 are the same and described above. Memristors 610 fabricated by method 200 are positioned at the crosslines between input circuitry 1501 and output circuitry 1503. Transmission lines 1502 interconnect all elements together to form 16×16 array neural network 1500A. In operation, as different input voltages are applied to the input terminal of input circuitry 1501, memristors 610 do not only retain these different voltages but also give them different synaptic weights. Output circuitry 1503 output these different weighed voltages.

The scope of the present invention, however, is not limited solely to these specific examples. Various modifications, whether explicitly stated in the specification or not, such as differences in thickness, oxygen pressure in deposition, stoichiometry, and material usage, are conceivable. The scope of the invention encompasses at least as broad as described by the following claims.

Within the scope of the present description, the reference to "an embodiment" or "the embodiment" or "some embodiments" means that a particular feature, structure or element described with reference to an embodiment is comprised in at least one embodiment of the described object. The sentences "in an embodiment" or "in the embodiment" or "in some embodiments" in the description do not therefore necessarily refer to the same embodiment or embodiments. The particular feature, structures or elements can be furthermore combined in any adequate way in one or more embodiments.

Within the scope of the present invention, Chromium (Cr) exists in different valence states (+1, +2, +3, +4, and +6) and form various oxides like $CrO$, $CrO_2$, $CrO_3$, $Cr_2O$, $Cr_2O_3$, $Cr_3O$, $Cr_3O_4$, $Cr_3O_8$, $Cr_5O_{12}$, and $Cr_8O_{21}$; Titanium (Ti) exists in different valence states of +2, +3, and +4, as in the oxygen compounds titanium monoxide, $TiO$, dititanium trioxide, $Ti_2O_3$, and titanium dioxide, $TiO_2$, respectively.

REFERENCES

[1] H. Spencer, *The Philosophy of Style: Together with an Essay on Style* (Allyn and Bacon, 1985).

[2] W. and B. F. and B. F. and S. I. James, *The Principles of Psychology* (*Vol.* 1): Macmillan London, James1890principles (1890).

[3] S. J. and N. P. Russell, *Artificial Intelligence: A Modern Approach, Malaysia* (Pearson Education Limited, 2016).

[4] B. L. and N. N. J. eds. Webber, *Readings in Artificial Intelligence* (Morgan Kaufmann, 2014).

[5] S. S. Haykin, *Neural Networks and Learning Machines* (Prentice Hall, New York, 2009).

[6] M. and M. S. and M. A. Figurnov, *Implicit Reparameterization Gradients*, Adv Neural Inf Process Syst 31, 441 (2018).

[7] J. R. Whitlock, A. J. Heynen, M. G. Shuler, and M. F. Bear, *Learning Induces Long-Term Potentiation in the Hippocampus*, Science (1979) 313, 1093 (2006).

[8] J.-H. Choi et al., *Interregional Synaptic Maps among Engram Cells Underlie Memory Formation*, Science (1979) 360, 430 (2018).

[9] C. M. and others Bishop, *Neural Networks for Pattern Recognition* (Oxford university press, 1995).

[10] A. and S. I. and H. G. E. Krizhevsky, *ImageNet Classification with Deep Convolutional Neural Networks* (Curran Associates Inc., 2012).

[11] Y. Zhang et al., *Brain-Inspired Computing with Memristors: Challenges in Devices, Circuits, and Systems*, Appl Phys Rev 7, 011308 (2020).

[12] Z. Wang et al., *Memristors with Diffusive Dynamics as Synaptic Emulators for Neuromorphic Computing*, Nature Materials 2017 16:1 16, 101 (2016).

[13] F. Pan, S. Gao, C. Chen, C. Song, and F. Zeng, *Recent Progress in Resistive Random Access Memories: Materials, Switching Mechanisms, and Performance*, Materials Science and Engineering: R: Reports 83, 1 (2014).

[14] R. Waser, R. Dittmann, C. Staikov, and K. Szot, *Redox-Based Resistive Switching Memories-Nanoionic Mechanisms, Prospects, and Challenges*, Adv Mater 21, 2632 (2009).

[15] S. Yu, B. Gao, Z. Fang, H. Yu, J. Kang, and H. S. P. Wong, *A Low Energy Oxide-Based Electronic Synaptic Device for Neuromorphic Visual Systems with Tolerance to Device Variation*, Advanced Materials 25, 1774 (2013).

EXPLANATION OF REFERENCE NUMERALS

100A Von Neumann neural network
100B neuromorphic neural network
111 multiplexer
112 array of SRAM
113 output circuitry
121 input neurons
122 hidden layer neurons
123 output neurons
124 communication links
125 synapses
131 communication links
132 bottleneck in communication links
141 input neurons
142 hidden layer neurons
143 output neurons
144 prior-art memristor
300 magnetron sputtering apparatus
301 main chamber
302 pressure pump conduit
303 gas inlet
304 first electrode (e.g., anode)
305 first base
306 second electrode (e.g., cathode)
307 second base
311 Ti or Cr target
312 shadow mask
314 substrate
401 glass substrate
402 shadow mask
403 line-up holes
404 openings
405 bottom electrode (Ti)
501 shadow mask
502 line-up holes
503 openings for resistive layers
505 first CrOx layer
506 second TiOy layer
601 shadow mask for top electrode
602 line-up holes
603 opening patterns for top electrodes
608 top Cr electrode
610 final memristor cell
800 test setup for DUT memristor
801 first directional coupler
802 second directional coupler
803 current source 804 current limiter
805 voltage source
806 voltage limiter
807 switch
808 ammeter
809 electrical wires
1500A N×M neural network
1500B schematic diagram of 16×16 neural network
1501 input circuitry
1502 transmission lines
1503 output circuitry

What is claimed is:

1. A method for fabricating a memristor device, comprising:
   (a) depositing a first metal electrode on a substrate using a physical vapor deposit (PVD) sputtering method at the room temperature, wherein said first metal electrode has a dog bone shape and a first terminal and a second terminal;
   (b) depositing a amorphous Chromium oxide (CrO$_x$) layer directly on top and on a middle section of said first metal electrode using said physical vapor deposit (PVD) sputtering method with Chromium (Cr) having a purity of 99.95%;
   (c) depositing a Titanium oxide (TiO$_y$) layer directly on top of said amorphous CrO$_x$ layer using said physical vapor deposit (PVD) sputtering method with Titanium (Ti) vapor having a purity of 99.2%-99.7%; and
   (d) depositing a second metal electrode directly on said TiO$_y$ layer using said physical vapor deposit (PVD) sputtering method; wherein said second metal electrode has a dog bone shape and a third terminal and a fourth terminal, said second metal electrode is deposited perpendicular to said first metal electrode; and said first terminal, said second terminal, said third terminal, and said fourth terminal are extended beyond the edges of said amorphous Chromium oxide (CrO$_x$) layer and said Titanium oxide (TiO$_y$) layer so that said memristor device is characterized by having a multi-functional capabilities of a Schottky Barrier diode, a non-linear capacitor, and a nonvolatile analog memory.

2. The method of claim 1 wherein said dog bone shape of said first metal electrode comprises a connective strip with a width of 500 μm and said first terminal and said second terminal have a 1.5 mm×1.5 mm square shape.

3. The method of claim 1 wherein said first metal electrode comprises Titanium (Ti), wherein said Schottky Barrier diode comprises a first Schottky barrier diode which is formed between said first metal electrode and said amorphous CrOx layer.

4. The method of claim 3 wherein said Titanium (Ti) electrode has a thickness of 50 nm to 150 nm, preferably 70 nm.

5. The method of claim 4 wherein said second metal electrode comprises Chromium (Cr), wherein said Schottky Barrier diode comprises a second Schottky barrier diode which is formed between said second metal electrode and said TiOy layer.

6. The method of claim 5 wherein said Chromium (Cr) electrode has a thickness of 50 nm to 150 nm, preferably 70 nm.

7. The method of claim 1 wherein said substrate is a glass substrate.

8. The method of claim 1 wherein said step (a) of depositing a first metal electrode on a substrate comprises said physical vapor deposit (PVD) method that uses a DC sputtering of Argon (Ar) gas in a vacuum chamber set at a working pressure of $3 \times 10^{-3}$ Torr with a base vacuum pressure of $7.5 \times 10^{-6}$ Torr.

9. The method of claim 8 wherein electrodes of said vacuum chamber is applied a power of 100 W for 5 minutes.

10. The method of claim 9 wherein said physical vapor deposit (PVD) method comprises a reactive sputtering deposition that uses Argon (Ar) and Oxygen (O$_2$) gases in a vacuum chamber set at a pressure of $7 \times 10^{-3}$ Torr with a base vacuum pressure of $7.5 \times 10^{-6}$ Torr.

11. The method of claim 10 wherein said dog bone shape of said Chromium (Cr) electrode comprises a connective strip with a width of 500 μm and said third terminal and said fourth terminal have a 1.5 mm×1.5 mm square shape.

12. The method of claim 11 wherein said CrOx layer has a thickness of 130 nm.

13. The method of claim 12 wherein said TiOy layer has a thickness of 160 nm.

14. A memristor device, comprising:
   a first metal electrode deposited on a glass substrate, wherein said first metal electrode has a dog bone shape and a first terminal and a second terminal;
   a 99.95% Chromium (Cr) in an amorphous Chromium oxide (CrO$_x$) layer deposited directly on top of and on a middle of said first metal electrode;
   a 99.2%-99.7% Titanium in a Titanium oxide (TiO$_y$) layer deposited directly on top of said CrO$_x$ layer; and
   a second metal electrode formed directly on said TiO$_y$ layer; wherein said second metal electrode has a dog bone shape and a third terminal and a fourth terminal; said second metal electrode is deposited perpendicular to said first metal electrode; and said first terminal, said second terminal, said third terminal, and said terminal are extended beyond the edges of said amorphous Chromium oxide (CrO$_x$) layer and said Titanium oxide (TiO$_y$) layer; wherein said memristor device is characterized by having a multi-functional capabilities of a Schottkey barrier diode, a non-linear capacity, and a nonvolatile analog memory.

15. The memristor device of claim 14 wherein said first metal electrode comprises Titanium (Ti), wherein said Schottky barrier diode comprises a first Schottky barrier diode which is formed between said first metal electrode and said CrOx layer.

16. The memristor device of claim 15 wherein said Ti layer has a thickness between 50 nm to 150 nm, preferably 70 nm.

17. The method of claim 15 wherein said second metal electrode comprises Chromium (Cr), wherein said Schottky barrier diode comprises a second Schottky barrier diode which is formed between said second metal electrode and said TiOy layer.

18. The memristor device of claim 17 wherein said Cr layer has a thickness between 50 nm to 150 nm, preferably 70 nm.

19. A neural network, comprising:
   an input layer comprising a plurality of input neurons;
   a plurality of hidden layers comprising a second plurality of processing neurons; and
   an output layer comprising a plurality of output neurons, wherein said input layer, said plurality of hidden layers, and said output layers are connected together by a plurality of memristors, wherein each of said memristors further comprises:
   a Titanium (Ti) electrode deposited on a glass substrate, wherein said Ti electrode has a dog bone shape and a first terminal and a second terminal;

a 99.95% Chromium (Cr) in an amorphous Chromium oxide ($CrO_x$) layer directly on top of and on a middle of said Ti electrode;

a 99.2%-99.7% Titanium in a Titanium oxide ($TiO_y$) layer directly on top of said $CrO_x$ layer; and a Chromium (Cr) electrode formed directly on said TiOy layer; wherein said Cr electrode has a dog bone shape and a third terminal and a fourth terminal; said Cr electrode is deposited perpendicular to said Ti electrode; and said first terminal, said second terminal, said third terminal, and said fourth terminal are extended beyond the edges of said amorphous Chromium oxide ($CrO_x$) and said Titanium oxide ($TiO_y$); wherein said memristor device is characterized by having a multi-functional capabilities comprising a Schottky barrier diode, a non-linear capacitor, and a nonvolatile analog memory.

20. The neural network of claim 19 wherein said amorphous $CrO_x$ layer has a thickness of 130 nm, said $TiO_y$ layer has a thickness of 160 nm, said first Ti electrode has a thickness of 50 nm to 100 nm, preferably 70 nm; and said second Cr electrode has a thickness of 50 nm to 150 nm, preferably 70 nm, wherein said Schottky barrier diode comprises a first Schottky barrier diode which is formed between said first metal electrode and said TiOy layer and wherein said Schottky barrier diode comprises a second Schottky barrier diode which is formed between said second metal electrode and said amorphous CrOx layer.

* * * * *